United States Patent
Yim et al.

(10) Patent No.: US 10,734,280 B2
(45) Date of Patent: Aug. 4, 2020

(54) INTEGRATED CIRCUIT DEVICES AND METHOD OF MANUFACTURING THE SAME

(71) Applicant: Samsung Electronics Co., Ltd., Suwon-si, Gyeonggi-do (KR)

(72) Inventors: Jeong-hyuk Yim, Seoul (KR); Kuo Tai Huang, Seongnam-si (KR); Wan-don Kim, Seongnam-si (KR); Sang-jin Hyun, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/154,896

(22) Filed: Oct. 9, 2018

(65) Prior Publication Data

US 2019/0148226 A1 May 16, 2019

(30) Foreign Application Priority Data

Nov. 16, 2017 (KR) .......................... 10-2017-0153320

(51) Int. Cl.
  *H01L 21/768* (2006.01)
  *H01L 23/522* (2006.01)
  (Continued)

(52) U.S. Cl.
  CPC .. *H01L 21/76876* (2013.01); *H01L 21/76804* (2013.01); *H01L 21/76846* (2013.01);
  (Continued)

(58) Field of Classification Search
  CPC .......... H01L 21/76846; H01L 23/5226; H01L 23/53223; H01L 23/53238;
  (Continued)

(56) References Cited

U.S. PATENT DOCUMENTS 8,058,728 B2 11/2011 Ishizaka et al.
8,524,600 B2 9/2013 Lei et al.
(Continued)

OTHER PUBLICATIONS

Walter D. Pilkey, "Formulas for Stress, Strain, and Structural Matrices, Second Edition," 2005, John Wiley & Sons, Inc. p. 201, Table 4-8 (Year: 2005).*

(Continued)

*Primary Examiner* — Allan R Wilson
(74) *Attorney, Agent, or Firm* — Harness, Dickey & Pierce, P.L.C.

(57) ABSTRACT

An integrated circuit (IC) device includes a substrate having a fin-type active region extending in a first direction, a gate structure intersecting the fin-type active region on the substrate, the gate structure extending in a second direction perpendicular to the first direction and parallel to a top surface of the substrate, source and drain regions on both sides of the gate structure, and a first contact structure electrically connected to one of the source and drain regions, the first contact structure including a first contact plug including a first material and a first wetting layer surrounding the first contact plug, the first wetting layer including a second material having a lattice constant that differs from a lattice constant of the first material by about 10% or less.

14 Claims, 21 Drawing Sheets

(51) Int. Cl.
   *H01L 29/66* (2006.01)
   *H01L 29/417* (2006.01)
   *H01L 23/532* (2006.01)
   *H01L 29/78* (2006.01)

(52) U.S. Cl.
   CPC .... *H01L 23/5226* (2013.01); *H01L 23/53223* (2013.01); *H01L 23/53238* (2013.01); *H01L 23/53266* (2013.01); *H01L 23/53285* (2013.01); *H01L 29/41775* (2013.01); *H01L 29/41791* (2013.01); *H01L 29/6656* (2013.01); *H01L 29/66545* (2013.01); *H01L 29/66795* (2013.01); *H01L 29/785* (2013.01)

(58) Field of Classification Search
   CPC ......... H01L 23/53266; H01L 23/53285; H01L 29/41775; H01L 29/41791; H01L 29/6656; H01L 29/785
   See application file for complete search history.

(56) References Cited

U.S. PATENT DOCUMENTS

| | | | |
|---|---|---|---|
| 9,472,502 | B1 | 10/2016 | Lee et al. |
| 9,514,983 | B2 | 12/2016 | Jezewski et al. |
| 9,613,900 | B2 | 4/2017 | Yang et al. |
| 9,972,692 | B2* | 5/2018 | Choi .................. H01L 27/0924 |
| 10,141,260 | B1* | 11/2018 | Chan .................. H01L 23/5283 |
| 10,418,280 | B2* | 9/2019 | Basker ............. H01L 29/41791 |
| 2011/0233780 | A1 | 9/2011 | Gordon et al. |
| 2016/0233164 | A1* | 8/2016 | Choi .................. H01L 27/0924 |
| 2016/0240433 | A1 | 8/2016 | Ishizaka |
| 2017/0092590 | A1 | 3/2017 | Spooner et al. |
| 2018/0211874 | A1* | 7/2018 | Basker ............. H01L 21/76897 |
| 2018/0342459 | A1* | 11/2018 | Chan .................. H01L 23/5283 |

OTHER PUBLICATIONS

James H. Edgar, "Properties of Group III Nitrides," 1994, Inspec, Section 1.3 (W.J. Meng, Dec. 1993), pp. 22-29 (Year: 1994).*

Manjon et al. "Lattice dynamics of wurtzite and rocksalt AlN under high pressure: Effect of compression on the crystal anisotropy of wurtzite-type semiconductors," May 16, 2008, Physical Review B 77, 205204, pp. 205204-1 to 205204-4.*

Q. Xia et al. "Pressure-induced rocksalt phase of aluminum nitride: a metastable structure at ambient condition," Jun. 15, 1993, Journal of Applied Physics, vol. 73, Issue12, pp. 8198-8200.*

Bhandari, Harish B. et al. "Chemical Vapor Deposition of Cobalt Nitride and its Application as an Adhesion-Enhancing Layer for Advanced Copper Interconnects." *ECS Journal of Solid State Science and Technology* 1.5 (2012): N79-N84.

* cited by examiner

US 10,734,280 B2

INTEGRATED CIRCUIT DEVICES AND METHOD OF MANUFACTURING THE SAME

CROSS-REFERENCE TO RELATED APPLICATION

This application claims the benefit of Korean Patent Application No. 10-2017-0153320, filed on Nov. 16, 2017, in the Korean Intellectual Property Office, the disclosure of which is incorporated herein in its entirety by reference.

BACKGROUND

The inventive concepts relate to an integrated circuit (IC) device and a method of manufacturing the same, and more particularly, to an IC device including a fin-type active region and a method of manufacturing the same.

With a growing tendency for electronic products to become more lightweight, thinner, simpler, and/or smaller, there has been an increasing demand for high integration of IC devices. As the IC devices are downscaled, a short channel effect (SCE) of transistors may occur to thereby degrade the reliability of IC devices. An IC device including a fin-type active region has been proposed to reduce the SCE. However, with a reduction in the design rule, the size of a contact structure that provides electrical connection to the fin-type active region is also reduced.

SUMMARY

The inventive concepts provide an integrated circuit (IC) device having a contact structure that has a reduced size and/or provides more reliable electrical connection.

According to an aspect of the inventive concepts, there is provided an IC device including a substrate having a fin-type active region extending in a first direction, a gate structure intersecting the fin-type active region on the substrate, the gate structure extending in a second direction perpendicular to the first direction and parallel to a top surface of the substrate, source and drain regions on both sides of the gate structure, and a first contact structure electrically connected to one of the source and drain regions, the first contact structure including a first contact plug including a first material and a first wetting layer surrounding the first contact plug, the first wetting layer including a second material having a lattice constant that differs from a lattice constant of the first material by about 10% or less.

According to another aspect of the inventive concepts, there is provided an IC device including a substrate having a fin-type active region extending in a first direction, a gate structure intersecting the fin-type active region on the substrate, the gate structure extending in a second direction perpendicular to the first direction and parallel to a top surface of the substrate, source and drain regions on both sides of the gate structure, and a first contact structure electrically connected to one of the source and drain regions the first contact structure including a first contact plug including a first material and a first wetting layer surrounding the first contact plug, the first wetting layer including at least one of a third material and a fourth material. The third material includes an amorphous metal or an amorphous metal nitride, and the fourth material includes a superconductor metal or a superconductor metal nitride.

According to another aspect of the inventive concepts, there is provided an IC device including a substrate having a fin-type active region extending in a first direction, a gate structure intersecting the fin-type active region on the substrate, the gate structure extending in a second direction perpendicular to the first direction and parallel to a top surface of the substrate, source and drain regions on both sides of the gate structure, a first contact structure electrically connected to one of the source and drain regions, the first contact structure including a first contact plug including a first material and a first wetting layer surrounding the first contact plug, the first wetting layer including at least one of a second material, a third material, and a fourth material, and a second contact structure on the gate structure, the second contact structure electrically connected to the gate structure, the second contact structure including a second contact plug including the first material and a second wetting layer surrounding the second contact plug, the second wetting layer including at least one of the second material, the third material, and the fourth material. The second material includes a metal oxide or a metal nitride having a lattice constant that differs from a lattice constant of the first material by about 10% or less. The third material includes an amorphous metal or an amorphous metal nitride. The fourth material includes a superconductor metal or a superconductor metal nitride.

According to another aspect of the inventive concepts, there is provided a method of manufacturing an IC device. The method includes forming a fin-type active region on a substrate, the fin-type active region extending in a first direction, forming a gate structure on the substrate, the gate structure intersecting the fin-type active region, forming source and drain regions in the fin-type active region on both sides of the gate structure, forming an inter-gate dielectric layer on both sides of the gate structure to cover the source and drain regions, removing a portion of the inter-gate dielectric layer to form a first contact hole exposing top surfaces of the source and drain regions, forming a first wetting layer on an inner wall of the first contact hole by using at least one of a second material, a third material, and a fourth material, and forming a first contact plug on the first wetting layer by using a first material, the first contact plug filling a remaining portion of the first contact hole. The second material includes a metal oxide or a metal nitride having a lattice constant that differs from a lattice constant of the first material by about 10% or less. The third material includes an amorphous metal or an amorphous metal nitride. The fourth material includes a superconductor metal or a superconductor metal nitride.

BRIEF DESCRIPTION OF THE DRAWINGS

Embodiments of the inventive concepts will be more clearly understood from the following detailed description taken in conjunction with the accompanying drawings in which.

DETAILED DESCRIPTION OF THE EMBODIMENTS

Figure 1:
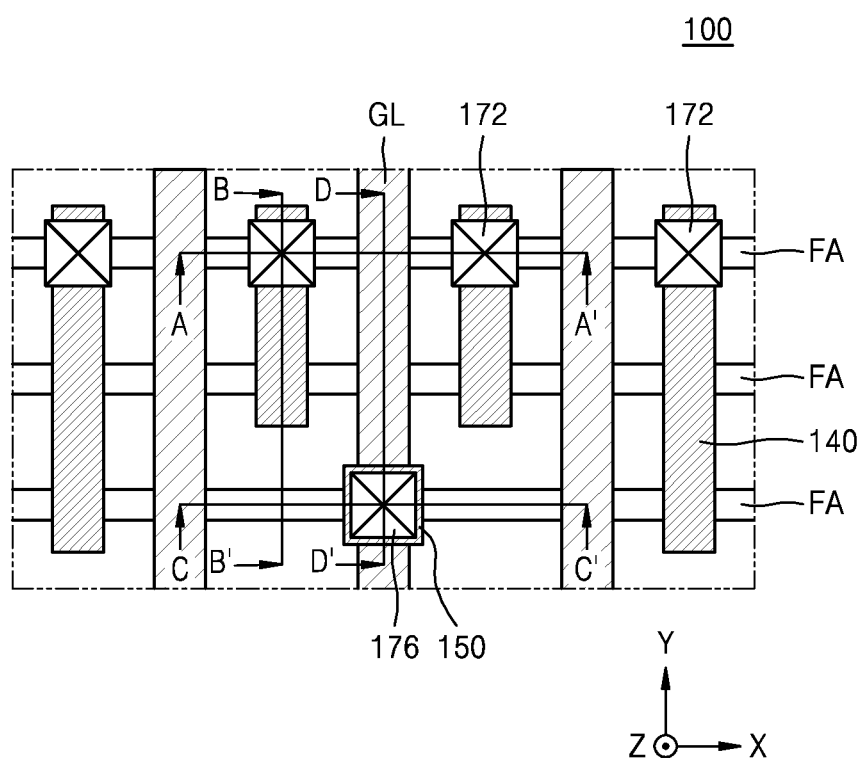
FIG. 1 illustrates the layout of an integrated circuit (IC) device according to some example embodiments.
Figure 2:
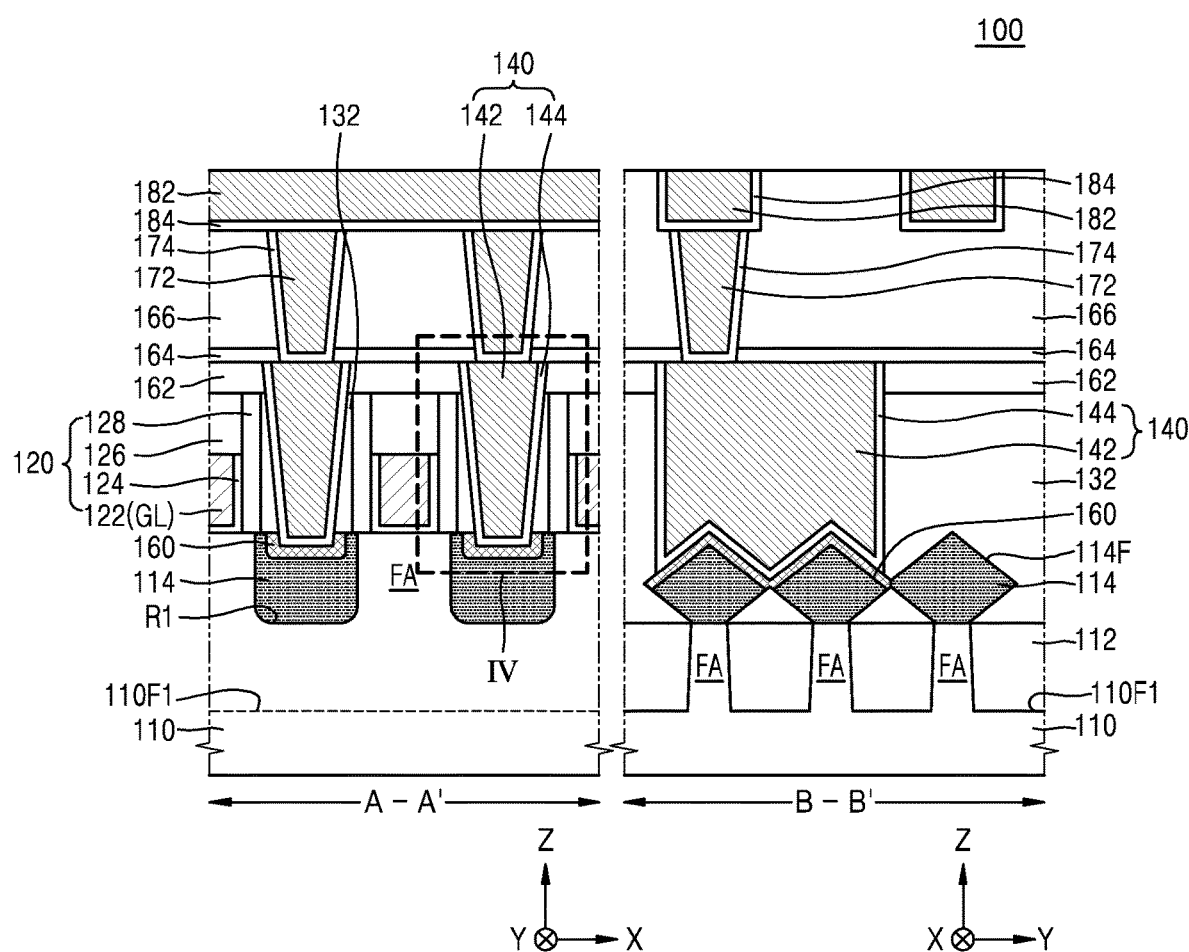
FIG. 2 is a cross-sectional view taken along lines A-A' and B-B' of FIG. 1.
Figure 3:
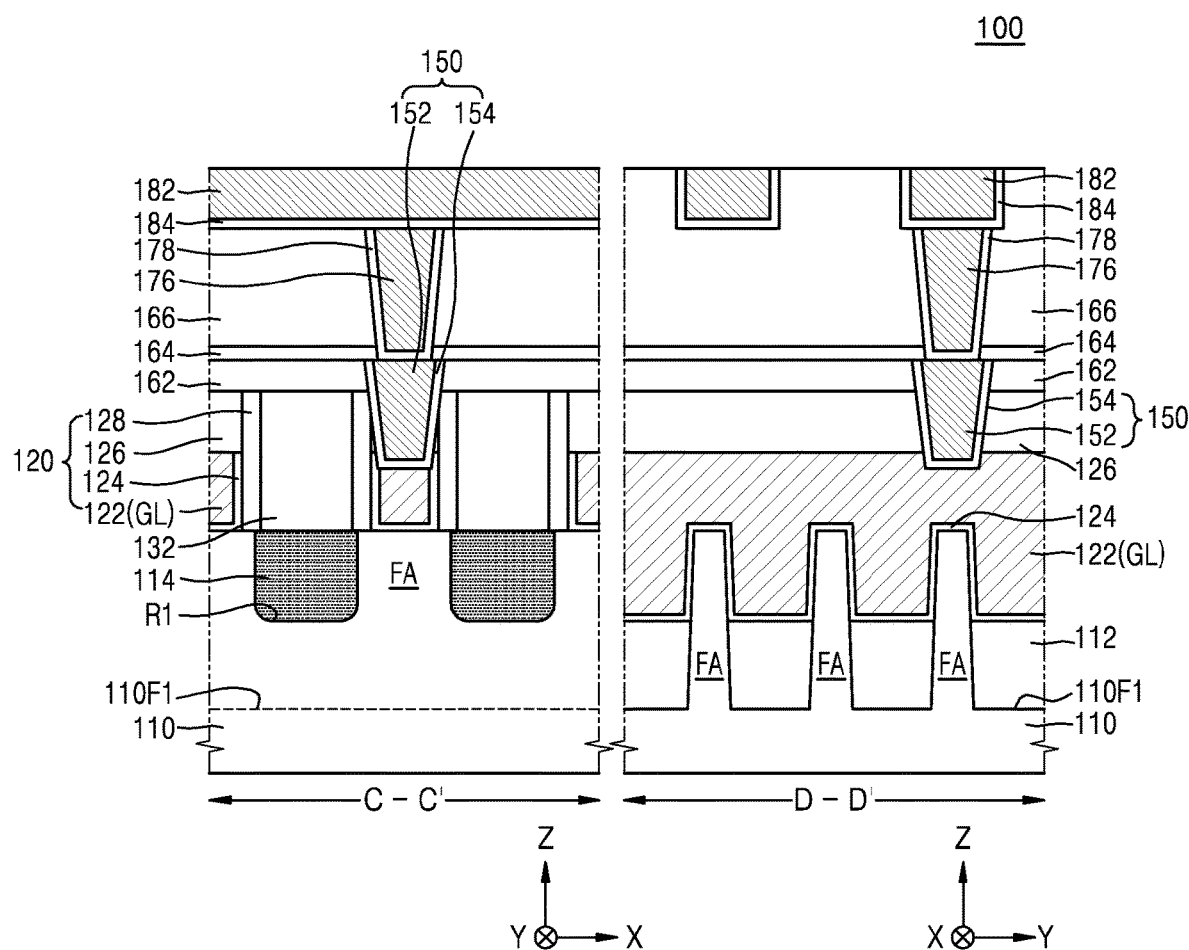
FIG. 3 is a cross-sectional view taken along lines C-C' and D-D' of FIG. 1.
Figure 4:
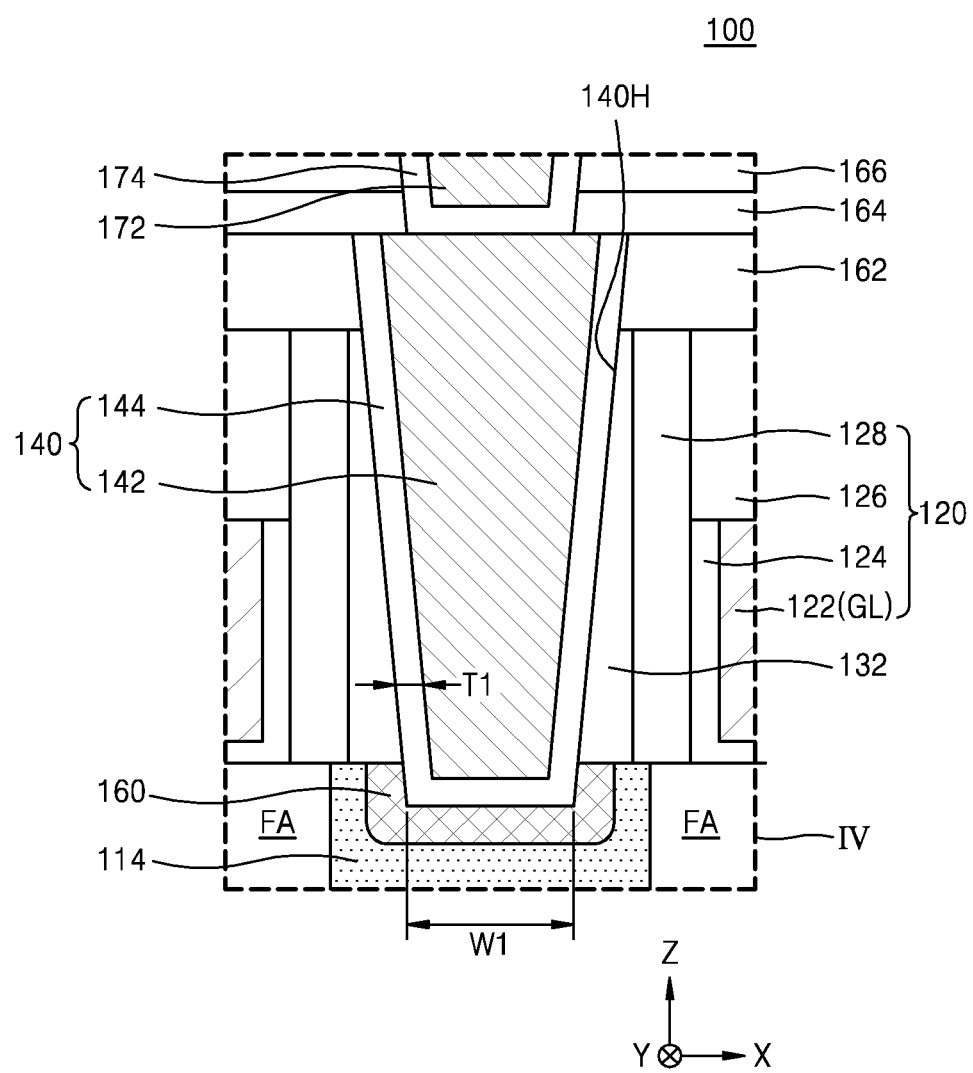
FIG. 4 is an enlarged view of a region IV of FIG. 2.

FIG. 1 illustrates the layout of an integrated circuit (IC) device 100 according to some example embodiments. FIG. 2 is a cross-sectional view taken along lines A-A' and B-B' of FIG. 1. FIG. 3 is a cross-sectional view taken along lines C-C' and D-D' of FIG. 1. FIG. 4 is an enlarged view of a region IV of FIG. 2. Only some components of the IC device 100 are illustrated in FIG. 1 for brevity.

Referring to FIGS. 1 to 3, a fin-type active region FA may protrude from a top surface 110F1 of a substrate 110. The fin-type active region FA may extend in a first direction (refer to X direction in FIG. 1) parallel to the top surface 110F1 of the substrate 110. An isolation layer 112 may be located on the substrate 110 to cover lower portions of both sidewalls of the fin-type active region FA.

In some example embodiments, the substrate 110 may include a Group IV semiconductor, such as silicon (Si) or germanium (Ge), a Group IV-IV compound semiconductor, such as silicon germanium (SiGe) or silicon carbide (SiC), or a group III-V compound semiconductor, such as gallium arsenide (GaAs), indium arsenide (InAs), or indium phosphide (InP). The substrate 110 may include a conductive region, for example, a doped well or a doped structure. The fin-type active region FA may be an active region included in a PMOS transistor or an active region included in an NMOS transistor.

A gate structure 120 may be located on the fin-type active region FA and the isolation layer 112 and extend in a second direction (refer to Y direction in FIG. 2) parallel to the top surface 110F1 of the substrate 110. The gate structure 120 may include a gate electrode 122, a gate insulating layer 124, a gate capping layer 126, and gate spacers 128.

As shown in FIG. 1, the gate electrode 122 may correspond to a gate line GL that extends in a second direction (refer to Y direction in FIG. 1). The gate electrode 122 may include doped polysilicon (poly-Si), a metal, a conductive metal nitride, a conductive metal carbide, a conductive metal silicide, or a combination thereof. For example, the gate electrode 122 may include aluminum (Al), copper (Cu), titanium (Ti), tantalum (Ta), tungsten (W), molybdenum (Mo), tantalum nitride (TaN), nickel silicide (NiSi), cobalt silicide (CoSi), titanium nitride (TiN), tungsten nitride (WN), titanium aluminide (TiAl), titanium aluminum nitride (TiAlN), tantalum carbonitride (TaCN), tantalum carbide (TaC), tantalum silicon nitride (TaSiN), or a combination thereof, but the inventive concepts are not limited thereto. In some example embodiments, the gate electrode 122 may include a work-function metal-containing layer and a gap-fill metal film. The work-function metal-containing layer may include at least one selected from the group consisting of titanium (Ti), tungsten (W), ruthenium (Ru), niobium (Nb), molybdenum (Mo), hafnium (Hf), nickel (Ni), cobalt (Co), platinum (Pt), ytterbium (Yb), terbium (Tb), dysprosium (Dy), erbium (Er), and palladium (Pd). The gap-fill metal film may include a W film or an Al film. In some example embodiments, the gate electrode 122 may include a stack structure of TiAlC/TiN/W, a stack structure of TiN/TaN/TiAlC/TiN/W, or a stack structure of TiN/TaN/TiN/TiAlC/TiN/W, but the inventive concepts are not limited thereto.

The gate insulating layer 124 may be located on a bottom surface and sidewalls of the gate electrode 122 and extend in the second direction. The gate insulating layer 124 may be between the gate electrode 122 and the fin-type active region FA and between the gate electrode 122 and a top surface of the isolation layer 112. The gate insulating layer 124 may include a silicon oxide film, a silicon oxynitride film, a high-k dielectric film having a higher dielectric constant than the silicon oxide film, or a combination thereof. The high-k dielectric film may include a metal oxide or a metal oxynitride. For example, the high-k dielectric film that may be used as the gate insulating layer 124 may include $HfO_2$, HfSiO, HfSiON, HfTaO, HfTiO, HfZrO, $ZrO_2$, $Al_2O_3$, an $HfO_2$—$Al_2O_3$ alloy, or a combination thereof, but the inventive concepts are not limited thereto.

The gate capping layer 126 may be located on the gate electrode 122. The gate capping layer 126 may cover a top surface of the gate electrode 122 and extend in the second direction (refer to Y direction in FIG. 1). In some example embodiments, the gate capping layer 126 may include silicon nitride.

The gate spacers 128 may be located on both the sidewalls of the gate electrode 122 and both sidewalls of the gate capping layer 126. The gate spacers 128 may be located on both the sidewalls of the gate electrode 122 and extend in a direction in which the gate electrode 122 extends. The gate insulating layer 124 may be between the gate electrode 122 and the gate spacers 128. In some example embodiments, the gate spacers 128 may include silicon oxide ($SiO_x$), silicon nitride ($SiN_x$), silicon oxynitride ($SiO_xN_y$), silicon carbonitride ($SiC_xN_y$), silicon oxycarbonitride ($SiO_xC_yN_z$) or a combination thereof.

In some example embodiments, the gate spacers 128 may include a plurality of layers including different materials. Although FIG. 2 illustrates a case in which the gate spacers 128 include a single layer, the gate spacers 128 may include a first spacer layer (not shown), a second spacer layer (not shown), and a third spacer layer (not shown), which are sequentially stacked on the sidewalls of the gate electrode 122. In some example embodiments, the first spacer layer and the third spacer layer may include silicon nitride, silicon oxide, or silicon oxynitride. The second spacer layer may include an insulating material having a lower dielectric constant than the first spacer layer. For example, the second spacer layer may include an air space.

Source and drain regions 114 may be located in the fin-type active region FA on both sides of the gate structure 120. Although the source and drain regions 114 may include a doped SiGe film, a doped Ge film, a doped SiC film, or a doped InGaAs film, the inventive concepts are not limited thereto. The formation of the source and drain regions 114 may include removing portions of the fin-type active region FA on both sides of the gate structure 120 to form recess regions R1 and growing a semiconductor layer by using an epitaxy process to fill the recess regions R1. In some example embodiments, each of the source and drain regions 114 may have a polygonal shape having a plurality of inclined surfaces 114F, as shown in FIG. 2.

For example, when the fin-type active region FA is an active region for an NMOS transistor, the source and drain regions 114 may include doped SiC. When the fin-type active region FA is an active region for a PMOS transistor, the source and drain regions 114 may include doped SiGe.

In addition, the source and drain regions 114 may include a plurality of semiconductor layers having different compositions. For example, the source and drain regions 114 may include a lower semiconductor layer (not shown), an upper semiconductor layer (not shown), and a capping semiconductor layer (not shown), which sequentially fill the recess regions R1. Each of the lower semiconductor layer, the upper semiconductor layer, and the capping semiconductor layer may include SiGe and be obtained by varying Si content and Ge content or the C content.

As shown in FIG. 2, an inter-gate dielectric layer 132 may be located between adjacent gate structures 120 to cover the source and drain regions 114. The inter-gate dielectric layer 132 may include silicon nitride, silicon oxide, or silicon oxynitride. A first insulating interlayer 162 may be formed on the gate structure 120 and the inter-gate dielectric layer 132.

A first contact structure 140 may be located over the source and drain regions 114. The first contact structure 140 may be located within a first contact hole 140H (refer to FIG. 4) that penetrates the first insulating interlayer 162 and the inter-gate dielectric layer 132. The first contact structure 140 may include a first contact plug 142 and a first wetting layer 144.

In some example embodiments, the first contact plug 142 may include a first material. The first material may include at least one of cobalt (Co), nickel (Ni), ruthenium (Ru), copper (Cu), aluminum (Al), a silicide thereof, and an alloy thereof. For example, the first contact plug 142 may include cobalt (Co). In some example embodiments, the first contact plug 142 may not or does not include tungsten (W).

The first wetting layer 144 may surround a sidewall and a bottom surface of the first contact plug 142 and be between the first contact plug 142 and the inter-gate dielectric layer 132, between the first contact plug 142 and the source and drain regions 114, or between the first contact plug 142 and a silicide layer 160.

In some example embodiments, the first wetting layer 144 may include a second material. The second material may include a metal nitride or a metal oxide having a lattice constant, which may differ from a lattice constant of the first material by as much as about 10% or less. For example, the second material may include at least one of cobalt nitride ($Co_4N$), zinc nitride (ZnN), zinc oxide (ZnO), aluminum nitride (AlN), and gallium nitride (GaN). The second material may include a material having good adhesion characteristics or wetting characteristics with respect to the first material.

In some example embodiments, when the first contact plug 142 includes cobalt (Co) and the first wetting layer 144 includes cobalt nitride ($Co_4N$), a lattice constant of cobalt (Co) may be about 3.5 angstroms (Å), and a lattice constant of cobalt nitride ($Co_4N$) may be about 3.48 Å. In this case, a lattice mismatch between the first material and the second material may correspond to about 0.57%. Here, the lattice mismatch may be defined as a ratio of a difference between the lattice constant of the second material and the lattice constant of the first material to the lattice constant of the first material. In other example embodiments, when the first contact plug 142 includes cobalt (Co) and the first wetting layer 144 includes zinc nitride (ZnN), a lattice constant of zinc nitride (ZnN) may be about 3.533 Å. In this case, a lattice mismatch between the first material and the second material may correspond to about 0.94%. In other example embodiments, when the first contact plug 142 includes cobalt (Co) and the first wetting layer 144 includes zinc oxide (ZnO), a lattice constant of zinc oxide (ZnO) may be about 3.25 Å. In this case, a lattice mismatch between the first material and the second material may correspond to about 7.14%. In other example embodiments, when the first contact plug 142 includes cobalt (Co) and the first wetting layer 144 includes gallium nitride (GaN), a lattice constant of gallium nitride (GaN) may be about 3.189 Å. In this case, a lattice mismatch between the first material and the second material may correspond to about 8.88%.

In an example process of forming the first contact structure 140, after the first wetting layer 144 is conformally formed within the first contact hole 140H (refer to FIG. 4), a first contact plug 142 may be formed on the first wetting layer 144 to fill the first contact hole 140H. In this case, a seed island of a metal material included in the first contact plug 142 may be more easily adhered to the surface of the first wetting layer 144 due to good wetting characteristics of the first wetting layer 144 to completely fill the first contact hole 140H and fill the inside of the first contact hole 140H without causing seams or voids.

For example, when the first wetting layer 144 includes cobalt nitride ($Co_4N$) and the first contact plug 142 includes cobalt (Co), since cobalt nitride ($Co_4N$) and cobalt (Co) has a lower lattice mismatch corresponding to about 0.57%, the first contact plug 142 may exhibit good wettability on the surface of the first wetting layer 144. For example, in a process of forming the first contact plug 142, the first contact plug 142 may be easily adhered to an inner wall of the first contact hole 140H or the first contact plug 142 may easily reflow within the first contact hole 140H. For example, the first contact plug 142 may completely fill the first contact hole 140H in a bottom-up manner, and voids or seams may not be formed in the first contact plug 142. For example, in the process of forming the first contact plug 142, a contact angle of the seed island of the first contact plug 142 with respect to the surface of the first wetting layer 144 may be about 90° or less, but the inventive concepts are not limited thereto.

In addition, the first wetting layer 144 may include a metal nitride or a metal oxide. The first wetting layer 144 may include a material layer that has a stable interface with the inter-gate dielectric layer 132 and/or the first contact plug 142 even when the material layer has a small thickness. Accordingly, the first wetting layer 144 may serve as a barrier configured to reduce or prevent a material (e.g., cobalt (Co) atoms) included in the first contact plug 142 from diffusing into the inter-gate dielectric layer 132. Also, since the first wetting layer 144 includes a material having a relatively low resistivity, the first wetting layer 144 may contribute toward reducing a resistance of the first contact structure 140.

In other example embodiments, the first wetting layer 144 may include a third material, which may include an amorphous metal or an amorphous metal nitride. For example, the third material may include at least one of tungsten nitride (WN), tungsten carbonitride (WCN), and titanium cobalt (TiCo). The third material may include a material having good adhesion characteristics or wetting characteristics with respect to the first material. In particular, when the first wetting layer 144 includes titanium cobalt (TiCo) and the first contact plug 142 includes cobalt (Co), since the first wetting layer 144 has excellent adhesion characteristics and wetting characteristics with respect to the first contact plug 142 and a low resistivity, the first contact structure 140 may have a relatively low resistance. Also, even when the first wetting layer 144 has a small thickness, the first wetting layer 144 may serve as a barrier configured to reduce or prevent a material (e.g., cobalt atoms) included in the first contact plug 142 from diffusing into the inter-gate dielectric layer 132.

In yet other embodiments, the first wetting layer 144 may include a fourth material, which may include a superconductor metal or a superconductor metal nitride. For example, the fourth material may include at least one of niobium aluminum ($Nb_3Al$), niobium nitride (NbN), and titanium cobalt ($Ti_2Co$). The fourth material may include a material having good adhesion characteristics or wetting characteristics with respect to the first material. Also, since the fourth material has a low resistivity, the first contact structure 140 may have a relatively low resistance.

FIGS. 2 and 4 illustrate an example in which the first wetting layer 144 is a single layer, but the inventive concepts are not limited thereto. Unlike shown in FIGS. 2 and 4, the first wetting layer 144 may have a stack structure of a plurality of layers, each of which may include at least one of the second material, the third material, and the fourth material. For example, the first wetting layer 144 may have a double-layered structure including a first sub-layer (not shown) and a second sub-layer (not shown), which are sequentially formed on an inner wall of the first contact hole 140H. The first sub-layer may include the fourth material, and the second sub-layer may include the second material.

As shown in FIG. 4, a bottom surface of the first contact structure 140 may have a first width W1 in a first direction (X direction), and the first wetting layer 144 may have a first thickness T1 in the first direction (X direction). In some example embodiments, the first thickness T1 of the first wetting layer 144 may be about 2% to about 20% the first width W1, but the inventive concepts are not limited thereto. The first thickness T1 of the first wetting layer 144 may be less than the first width W1 of the first contact structure 140. Thus, a volume of the first contact plug 142 (or a sectional area of the first contact plug 142) may be relatively large.

For example, when the first contact plug 142 includes a metal material, such as cobalt (Co), a fluorine (F)-containing source material, which is used to form a contact plug including tungsten (W), may not or is not used. When the fluorine-containing source material is used, it may be typically necessary to form a conductive barrier layer to a greater thickness to reduce or prevent the fluorine-containing source material or a resultant reaction by-product from damaging the gate spacers 128 or the inter-gate dielectric layer 132.

However, as described above, since the first contact plug 142 includes a metal material, such as cobalt (Co), the fluorine-containing source material may not or is not used, the first thickness T1 of the first wetting layer 144 may be relatively small, and the volume of the first contact plug 142 (or the sectional areas of the first contact plug 142) may be relatively great. Accordingly, the first contact structure 140 may have a relatively low resistance.

A second contact structure 150 may be located on the gate structure 120. In some example embodiments, lower portions of sidewalls of the second contact structure 150 may be surrounded by the gate spacer 128 and the gate capping layer 126, while upper portions of the sidewalls of the second contact structure 150 may be surrounded by the first insulating interlayer 162.

The second contact structure 150 may include a second contact plug 152 and a second wetting layer 154. In some example embodiments, a material included in the second contact plug 152 and a material included in the second wetting layer 154 may be applied from the descriptions of the first contact plug 142 and the first wetting layer 144. For example, the second contact plug 152 may include the first material, and the second wetting layer 154 may include at least one of the second material, the third material, and the fourth material. The second material may include a metal nitride or a metal oxide having a lattice constant, which may differ from a lattice constant of the first material by as much as about 10% or less. The third material may include an amorphous metal or an amorphous metal nitride, and the fourth material may include a superconductor metal or a superconductor metal nitride.

In some example embodiments, the second contact plug 152 and the second wetting layer 154 may be formed in the same operations as the processes of forming the first contact plug 142 and the first wetting layer 144, respectively. In other example embodiments, after the first contact structure 140 including the first contact plug 142 and the first wetting layer 144 is formed first, the second contact structure 150 including the second contact plug 152 and the second wetting layer 154 may be formed.

Optionally, a silicide layer 160 may be formed between the source and drain regions 114 and the first contact structure 140. The silicide layer 160 may include a metal silicide material. For example, the silicide layer 160 may include titanium silicide ($TiSi_x$) or nickel silicide ($NiSi_x$), but the inventive concepts are not limited thereto.

An etch stop layer 164 may be formed on the first contact structure 140, the second contact structure 150, and the first insulating interlayer 162, and a second insulating interlayer 166 may be formed on the etch stop layer 164. The etch stop layer 164 may include a material (e.g., silicon nitride, silicon oxynitride, or aluminum oxide) having an etch selectivity with respect to the second insulating interlayer 166. The second insulating interlayer 166 may include silicon oxide, a tetraethyl orthosilicate (TEOS) film, or an ultralow-k (ULK) film having an ultralow dielectric constant of about 2.2 to about 2.4. The ULK film may include a silicon oxycarbide (SiOC) film or a carbon-doped silicon oxide (SiCOH) film.

A first via 172 may be connected to the first contact structure 140, and a wetting layer 174 may surround a sidewall and a bottom surface of the first via 172. A second via 176 may be connected to the second contact structure 150, and a wetting layer 178 may surround a sidewall and a bottom surface of the second via 176.

In some example embodiments, a material included in the first via 172 and the second via 176 may be applied from the description of the first contact plug 142. For example, the first via 172 and the second via 176 may include the first material. Similarly, a material included in the wetting layers 174 and 178 may be applied from the description of the first wetting layer 144. For example, the wetting layers 174 and 178 may include at least one of the second material, the third material, and the fourth material. The second material may include a metal nitride or a metal oxide having a lattice constant, which may differ from a lattice constant of the first material by as much as about 10% or less. The third material may include an amorphous metal or an amorphous metal nitride, and the fourth material may include a superconductor metal or a superconductor metal nitride.

An interconnection layer 182 may be formed on the first via 172 and the second via 176. A wetting layer 184 may be further formed to surround sidewalls and a bottom surface of the interconnection layer 182. The second insulating interlayer 166 may surround sidewalls of the first via 172, the second via 176, and the interconnection layer 182. FIGS. 2 and 3 illustrate an example in which the interconnection layer 182 and the second insulating interlayer 166 are formed as a single layer. However, in another case, the interconnection layer 182 may include a stack structure of a plurality of interconnection layers located at different levels, and the second insulating interlayer 166 may have a stack structure of a plurality of insulating layers to surround the plurality of interconnection layers, respectively.

In general, when a contact plug is formed by forming a conductive barrier layer including titanium nitride (TiN) within a contact hole and filling the contact hole with a metal material, such as cobalt (Co), the inside of the contact plug may not be completely filled with the metal material due to a high difficulty of the process of filling the contact plug with the metal material. Thus, voids or seams may be generated in the contact plug. Due to the voids or seams, a contact structure may have a high resistance or the reliability of an IC device including the contact structure may be degraded.

However, according to the above-described IC device 100, the first contact structure 140 may include the first contact plug 142 including the first material and the first wetting layer 144 including at least one of the second material, the third material, and/or the fourth material, and the first wetting layer 144 may surround the first contact plug 142. The first wetting layer 144 may include a material having good adhesion characteristics or wetting characteristics with respect to the first contact plug 142. During the formation of the first contact plug 142, the first contact plug 142 may completely fill the first contact hole 140H, and voids or seams may not be formed in the first contact plug 142. Accordingly, the first contact structure 140 may have a reduced size and/or provide more reliable electrical connection.

Figure 5:
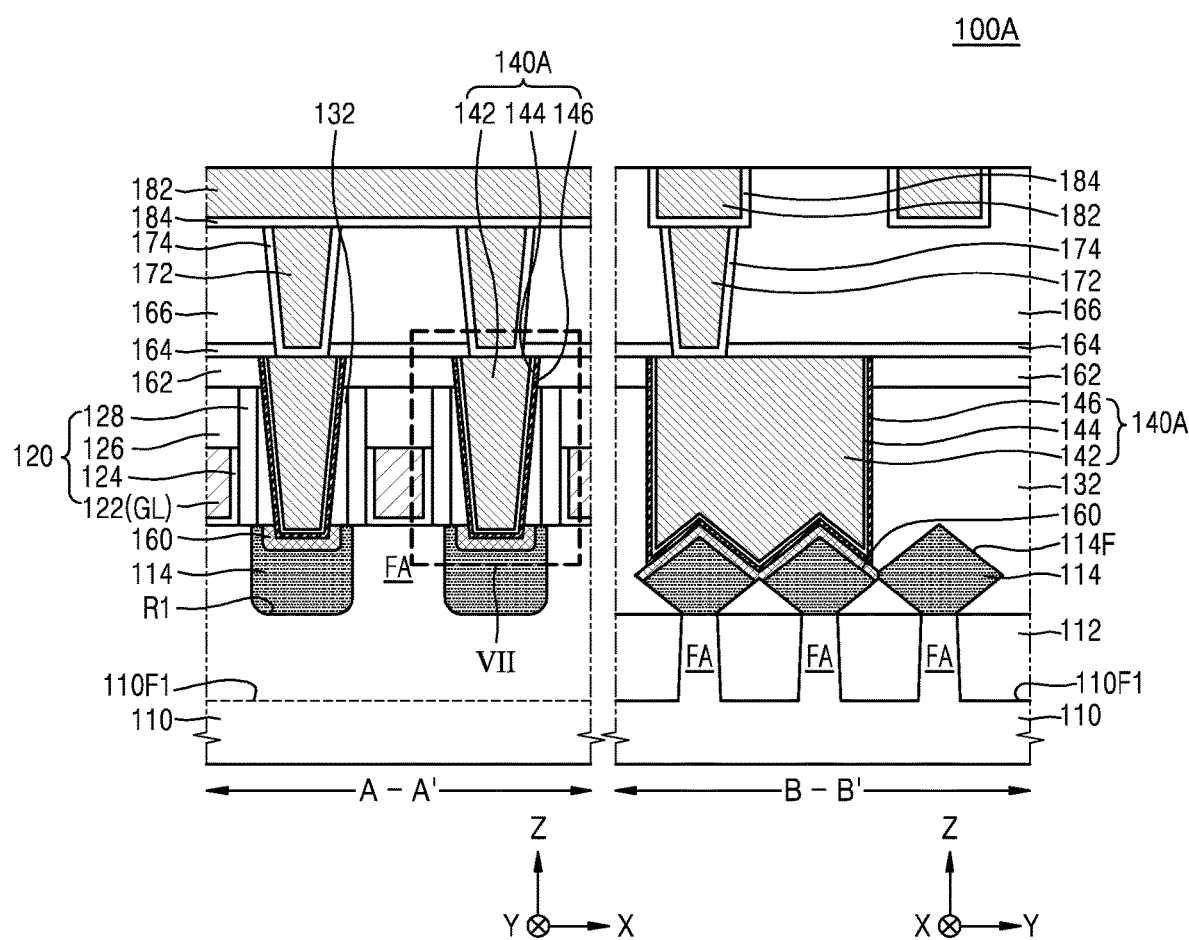
FIGS. 5 and 6 are cross-sectional views of an IC device according to some example embodiments.
Figure 6:
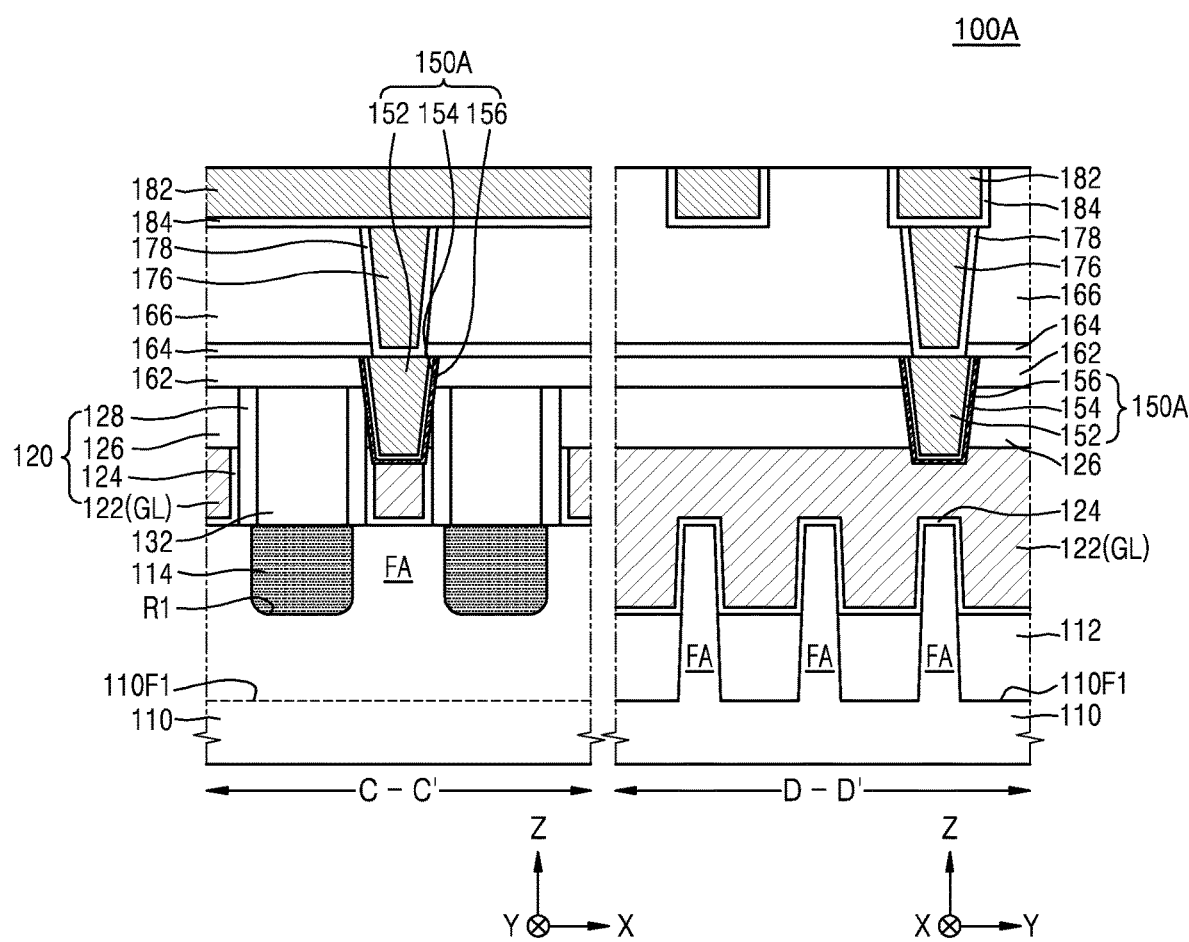
Figure 7:
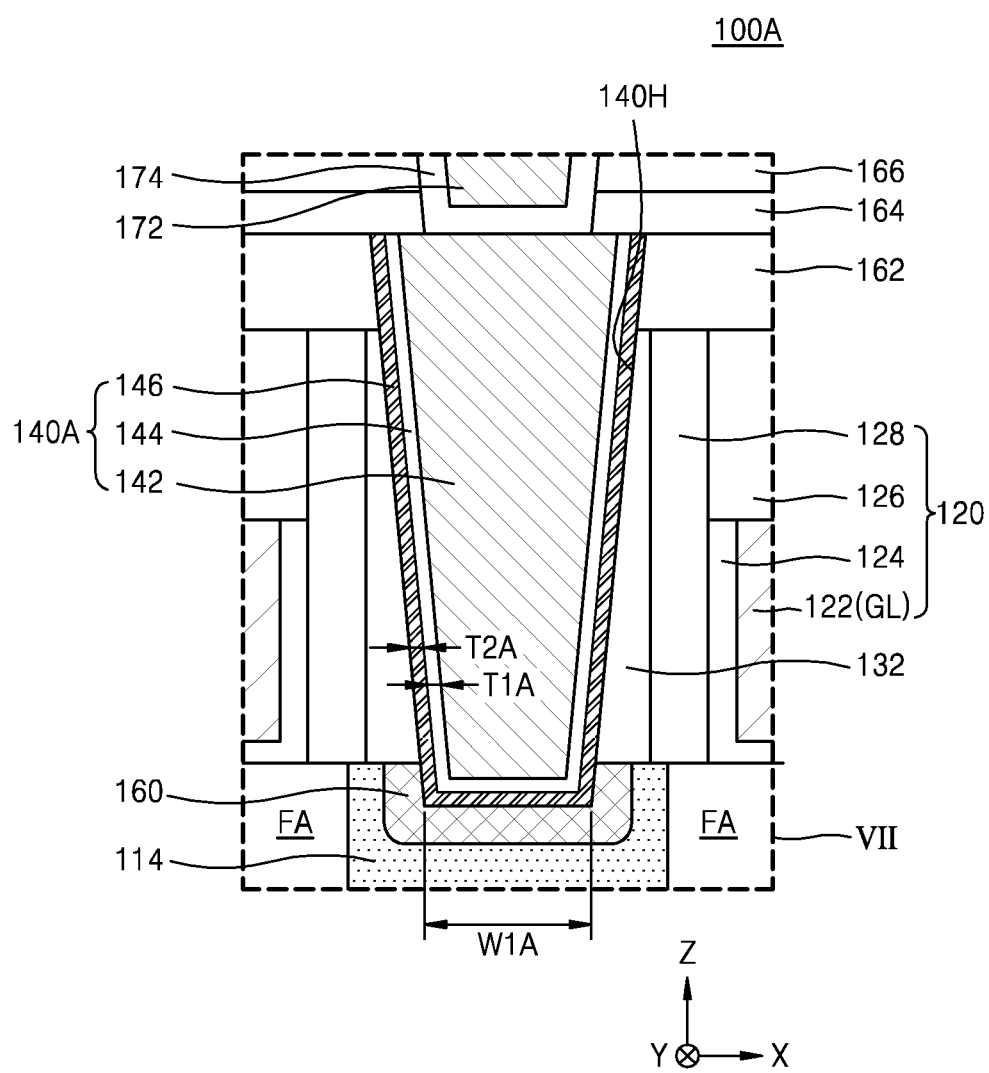
FIG. 7 is an enlarged view of a region VII of FIG. 5.

FIGS. 5 and 6 are cross-sectional views of an IC device 100A according to some example embodiments. FIG. 7 is an enlarged view of a region VII of FIG. 5. FIG. 5 is a cross-sectional view taken along lines A-A' and B-B' of FIG. 1. FIG. 6 is a cross-sectional view taken along lines C-C' and D-D' of FIG. 1. In FIGS. 5 to 7, the same reference numerals are used to denote the same elements as in FIGS. 1 to 4.

Referring to FIGS. 5 to 7, a first contact structure 140A may include a first contact plug 142, a first wetting layer 144, and/or a first conductive barrier layer 146. The first wetting layer 144 may surround a sidewall of the first contact plug 142, and the first conductive barrier layer 146 may surround an outer sidewall of the first wetting layer 144. For example, the first conductive barrier layer 146, the first wetting layer 144, and the first contact plug 142 may be sequentially located on an inner wall of the first contact hole 140H (refer to FIG. 7), which may penetrate an inter-gate dielectric layer 132 and a first insulating interlayer 162 and expose top surfaces of source and drain regions 114.

As described above with reference to FIGS. 1 to 4, the first contact plug 142 may include a first material, and the first wetting layer 144 may include at least one of a second material, a third material, and/or a fourth material. The first conductive barrier layer 146 may include at least one of titanium (Ti), titanium nitride (TiN), tantalum (Ta), and tantalum nitride (TaN).

As shown in FIG. 7, a bottom surface of the first contact structure 140A may have a first width W1A in a first direction (X direction), the first wetting layer 144 may have a first thickness T1A in the first direction, and the first conductive barrier layer 146 may have a second thickness T2A in the first direction. In some example embodiments, the first thickness T1A of the first wetting layer 144 may be about 1% to about 10% of the first width W1A, and the second thickness T2A of the first conductive barrier layer 146 may be about 1% to about 10% of the first width W1A, but the inventive concepts are not limited thereto. The first thickness T1A of the first wetting layer 144 and the second thickness T2A of the first conductive barrier layer 146 may be less than the first width W1A of the first contact structure 140A. Thus, the first contact plug 142 may have a relatively great volume so that the first contact structure 140A may have a low resistance.

A second contact structure 150A may include a second contact plug 152, a second wetting layer 154, and/or a second conductive barrier layer 156. The second conductive barrier layer 156 may include at least one of titanium (Ti), titanium nitride (TiN), tantalum (Ta), and tantalum nitride (TaN).

Since the first wetting layer 144 is formed between the first conductive barrier layer 146 and the first contact plug 142, the first contact plug 142 may completely fill the first contact hole 140H during the formation of the first contact plug 142, and voids or seams may not be formed in the first contact plug 142.

FIGS. 5 to 7 illustrate an example in which only the first conductive barrier layer 146 and the second conductive barrier layer 156 are formed to surround the first wetting layer 144 and the second wetting layer 154, respectively. However, unlike shown in FIGS. 5 to 7, a conductive barrier layer (not shown) may be further formed to surround at least one of wetting layers 174, 178, and 184.

Figure 8:
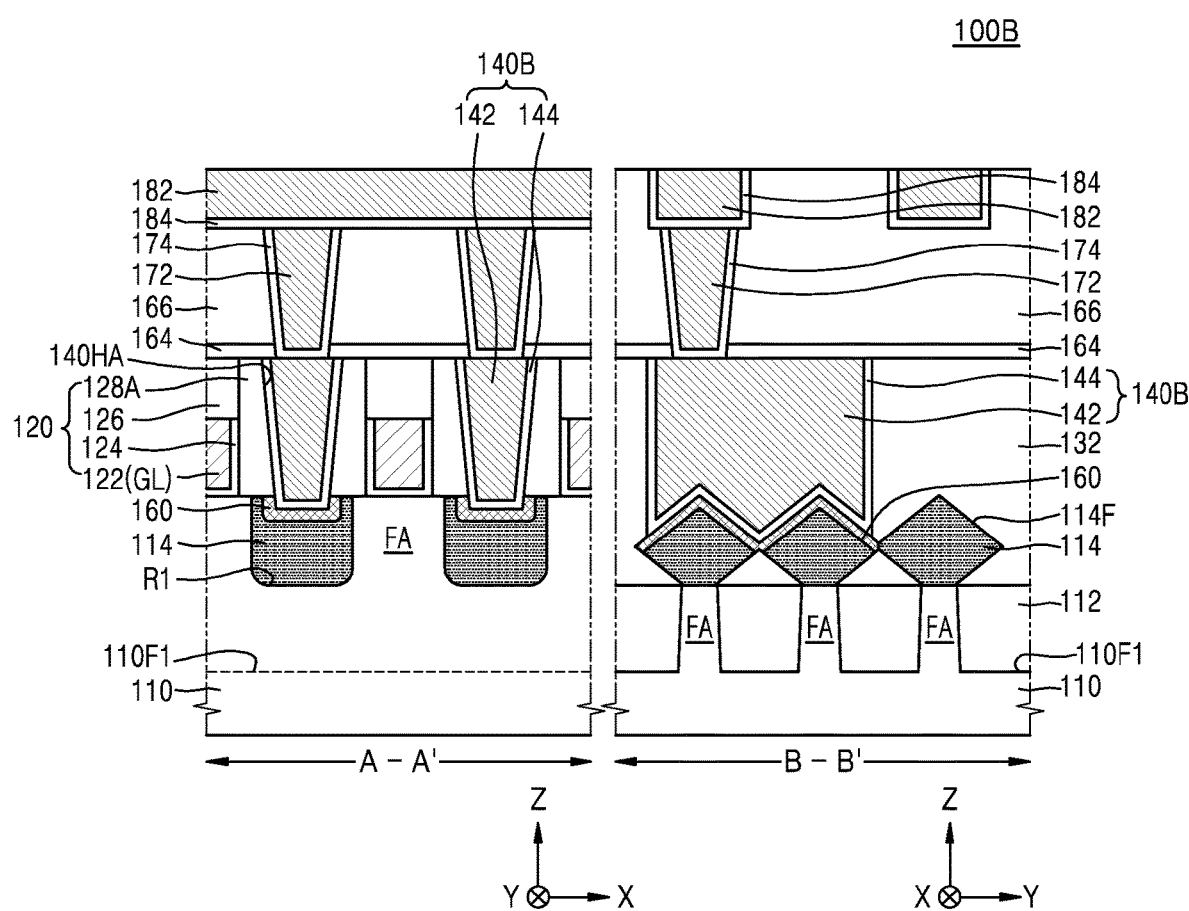
FIG. 8 is a cross-sectional view of an IC device according to some example embodiments.

FIG. 8 is a cross-sectional view of an IC device 100B according to some example embodiments. FIG. 8 is a cross-sectional view taken along lines A-A' and B-B' of FIG. 1. In FIG. 8, the same reference numerals are used to denote the same elements as in FIGS. 1 to 7.

Referring to FIG. 8, at least portions of a first contact structure 140B may be in direct contact with sidewalls of gate spacers 128A. For example, major-axis sidewalls of the first contact structure 140B may be in contact with gate spacers 128A between two adjacent gate structures 120, and minor-axis sidewalls of the first contact structure 140B may be in contact with an inter-gate dielectric layer 132. The first contact structure 140B may be formed to fill a first contact hole 140HA that is formed by using the gate spacers 128A and a gate capping layer 126 as a self-aligned mask. Thus, major-axis sidewalls of the first contact hole 140HA may be defined by the sidewalls of the gate spacers 128A, and the first contact structure 140B may be in direct contact with the gate spacers 128A. The first contact structure 140B may include a first contact plug 142 and a first wetting layer 144 that surrounds the first contact plug 142, and the first wetting layer 144 may be in direct contact with the sidewalls of the gate spacers 128A.

Since the first contact hole 140HA is formed by using the gate spacers 128A and the gate capping layer 126 as a self-aligned mask, the first contact hole 140HA may have a relatively large area. In addition, during the formation of the first contact plug 142, the first contact plug 142 may completely fill the inside of the first contact hole 140HA due to good wetting characteristics with respect to the first wetting layer 144, and voids or seams may not be formed in the first contact plug 142.

Figure 9:
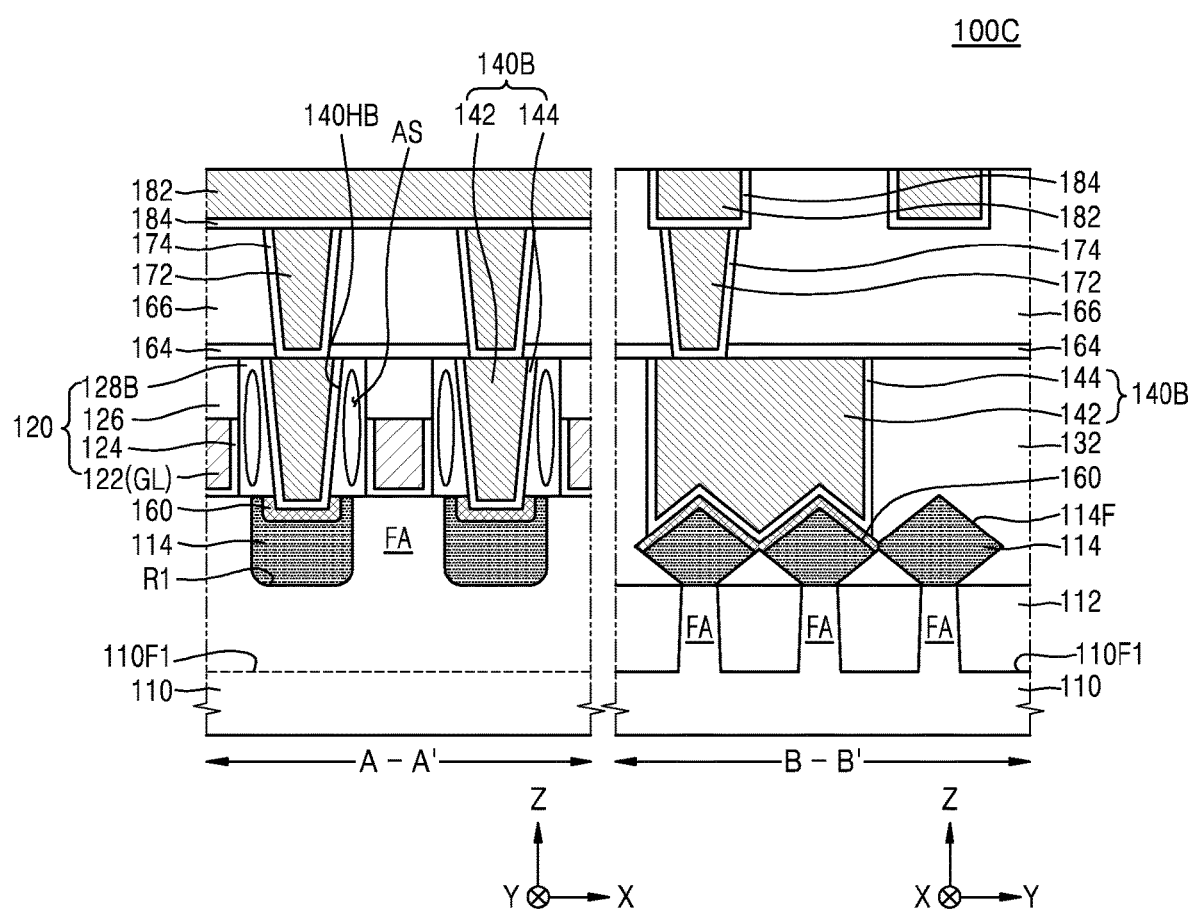
FIG. 9 is a cross-sectional view of an IC device according to some example embodiments.

FIG. 9 is a cross-sectional view of an IC device 100C according to an embodiment. FIG. 9 is a cross-sectional view taken along lines A-A' and B-B' of FIG. 1. In FIG. 9, the same reference numerals are used to denote the same elements as in FIGS. 1 to 8.

Referring to FIG. 9, at least portions of a first contact structure 140B may be in direct contact with sidewalls of gate spacers 128B. Each of the gate spacers 128B may include an air space AS. For example, the gate spacers 128 may be formed by using an insulating material having poor step coverage characteristics through a plasma-enhanced chemical vapor deposition (PECVD) process. For example, the gate spacers 128B may include silicon nitride, but the inventive concepts are not limited thereto.

In some example embodiments, as shown in FIG. 9, a first wetting layer 144 located on an inner wall of a first contact hole 140HB may be in direct contact with the gate spacers 128B. In other example embodiments, unlike shown in FIG. 9, a first conductive barrier layer (refer to 146 in FIG. 7) may be further formed between the first wetting layer 144 and the gate spacers 128B.

In example embodiments, any combination of the second material ($Co_4N$, ZnN, ZnO, AlN, and/or GaN), third material (WN, WCN, and/or TiCo), and/or fourth material ($Nb_3Al$, NbN, and $Ti_2Co$) may be used.

According to the above-described IC device 100C, the air space AS may be formed in each of the gate spacers 128B. Since the air space AS typically has a lower dielectric constant than an insulating material, a parasitic capacitance of the IC device 100C due to the gate spacers 128B may be reduced.

FIGS. 10A, 10B, 11A, 11B, 12A, 12B, 13A, 13B, 14A, 14B, 15A, and 15B are cross-sectional views of a method of manufacturing an IC device 100 according to some example embodiments.

Specifically, FIGS. 10A, 11A, 12A, 13A, 14A, and 15A are cross-sectional views taken along lines A-A' and B-B' of FIG. 1. FIGS. 10B, 11B, 12B, 13B, 14B, and 15B are cross-sectional views taken along lines C-C' and D-D' of FIG. 1. In FIGS. 10A to 15B, the same reference numerals are used to denote the same elements as in FIGS. 1 to 9.

Figure 10A:
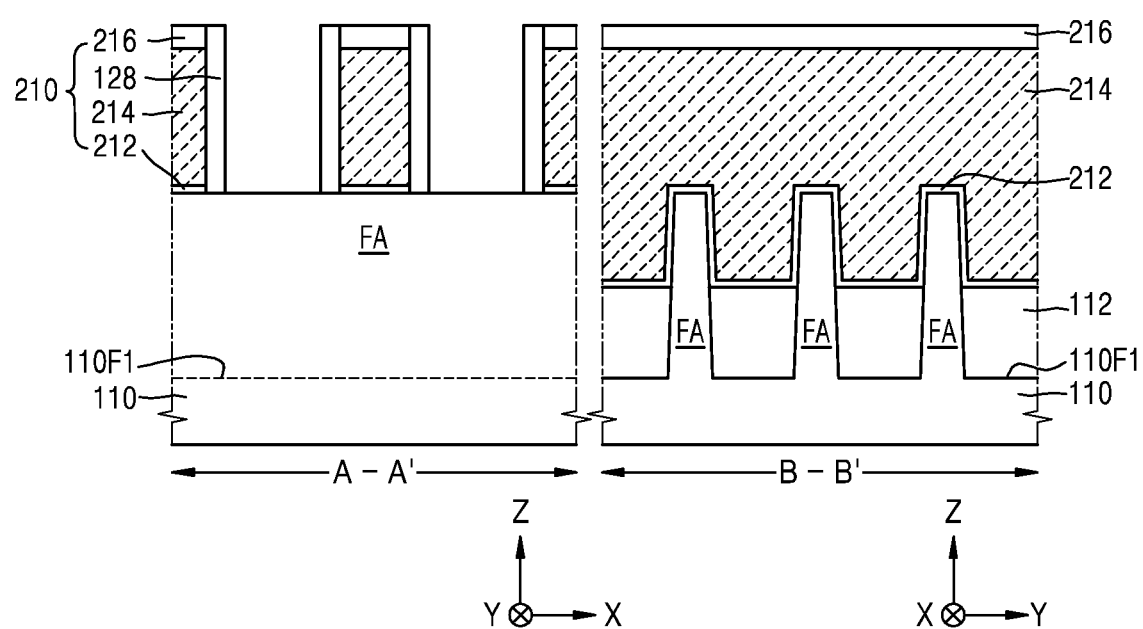
FIGS. 10A, 10B, 11A, 11B, 12A, 12B, 13A, 13B, 14A, 14B, 15A, and 15B are cross-sectional views of a method of manufacturing an IC device according to some example embodiments.
Figure 10B:
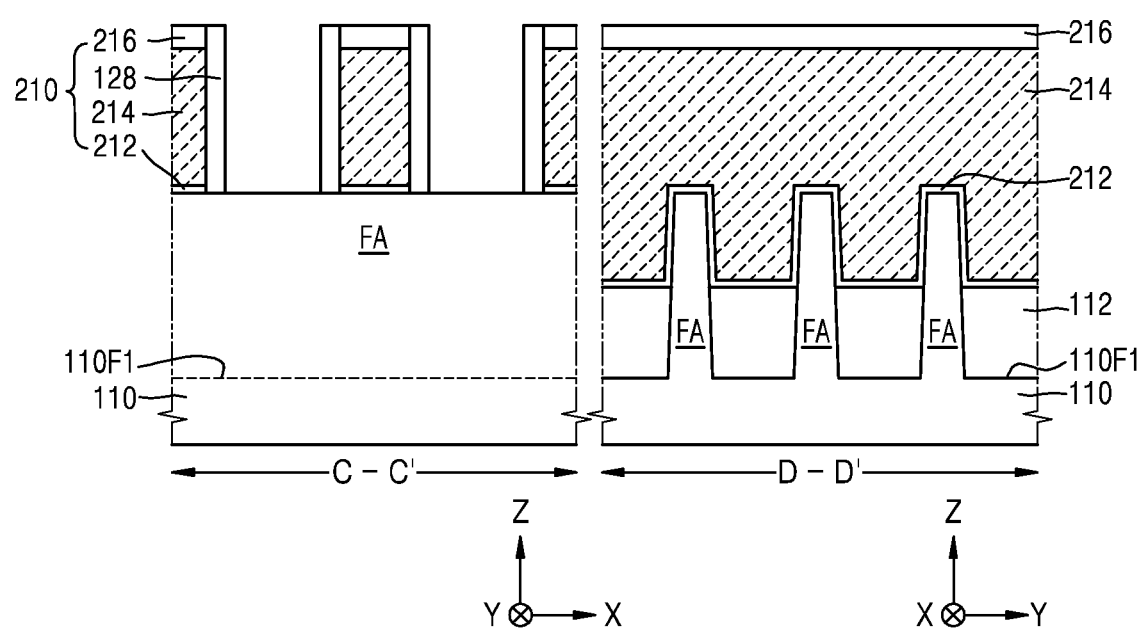

Referring to FIGS. 10A and 10B, a partial region of an active region of a substrate 110 may be etched to form a fin-type active region FA, which may protrude in a vertical direction from a top surface 110F1 of the substrate 110 and extend in one direction (X direction in FIG. 11).

An isolation layer 112 may be formed on the substrate 110 to cover both sidewalls of the fin-type active region FA. Although not shown, an interface layer may be further between the isolation layer 112 and the fin-type active region FA and conformally cover the sidewalls of the fin-type active region FA.

Thereafter, a sacrificial gate insulating layer (not shown), a sacrificial gate conductive layer (not shown), and a hard mask pattern 216 may be sequentially formed on the substrate 110, and the sacrificial gate conductive layer and the sacrificial gate insulating layer may be patterned by using the hard mask pattern 216 as an etch mask, thereby forming a sacrificial gate 214 and a sacrificial gate insulating layer pattern 212.

Subsequently, an insulating layer (not shown) may be formed by using an atomic layer deposition (ALD) process or a chemical vapor deposition (CVD) process to cover the hard mask pattern 216, the sacrificial gate 214, and the sacrificial gate insulating layer pattern 212. An anisotropic etching process may be performed on the insulating layer to form gate spacers 128 on sidewalls of the hard mask pattern 216, the sacrificial gate 214, and the sacrificial gate insulating layer pattern 212. The gate spacers 128 may include silicon nitride, but the inventive concepts are not limited thereto.

Here, the sacrificial gate insulating layer pattern 212, the sacrificial gate 214, the hard mask pattern 216, and the gate spacers 128 may be referred to as a sacrificial gate structure 210.

Figure 11A:
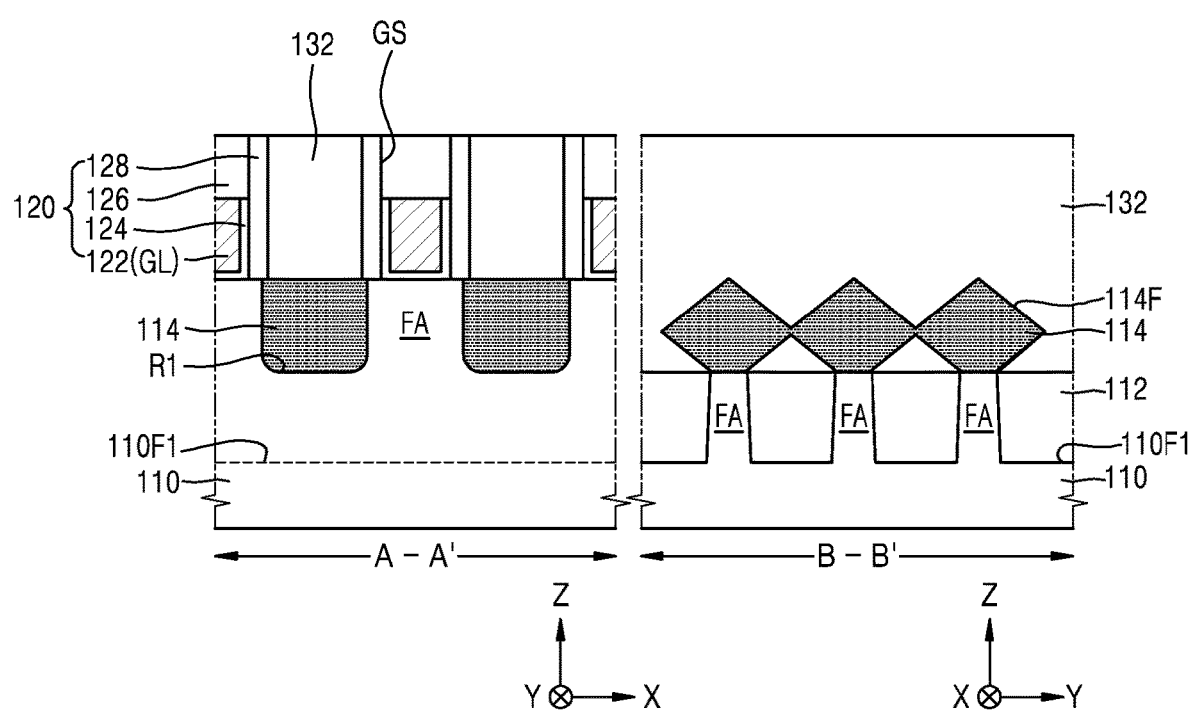
Figure 11B:
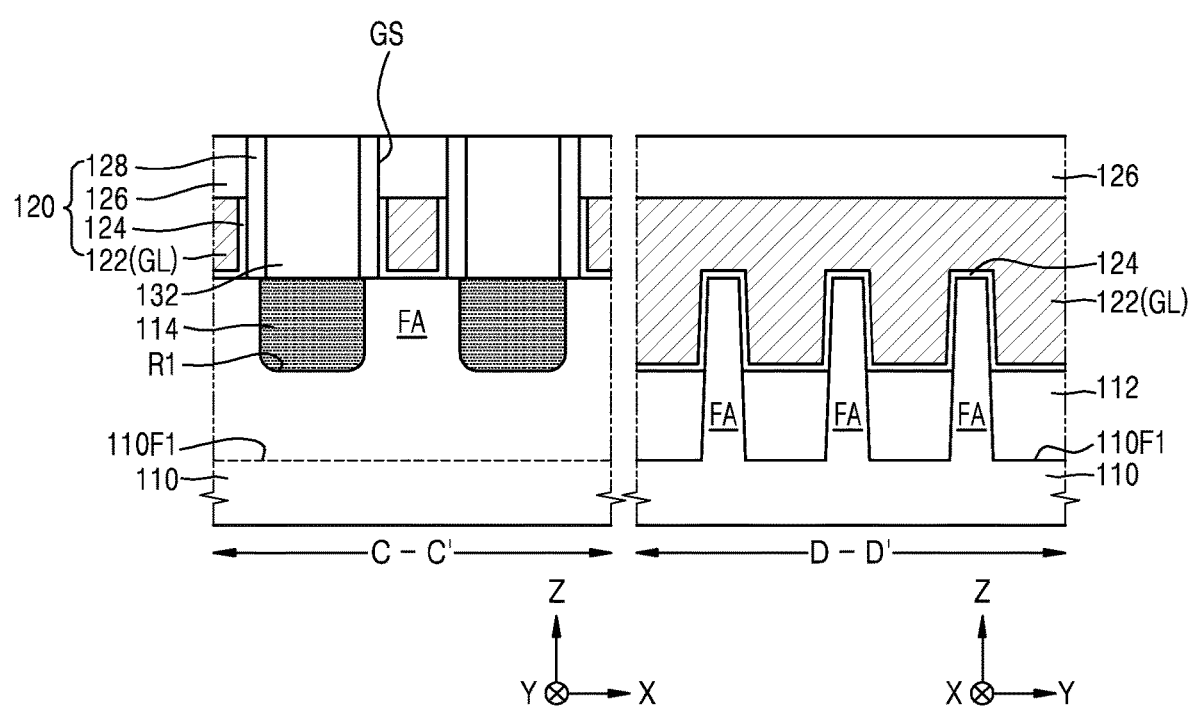

Referring to FIGS. 11A and 11B, portions of the fin-type active region FA on both sides of the sacrificial gate structure 210 (refer to FIG. 10A) may be etched to form recess regions R1, and source and drain regions 114 may be formed within the recess regions R1.

In some example embodiments, the source and drain regions 114 may be formed by performing an epitaxy process by using sidewalls of the fin-type active region FA and a top surface of the substrate 110, which are exposed by inner walls of the recess regions R1. The epitaxy process may be a CVD process, such as a vapor-phase epitaxy (VPE) process and an ultrahigh vacuum CVD (UHV-CVD) process, a molecular beam epitaxy (MBE) process, or a combination thereof. In the epitaxy process, a liquid precursor or a gaseous precursor may be used as a precursor required for forming the source and drain regions 114.

The source and drain regions 114 may be formed to have various shapes by adjusting growth conditions in the epitaxy process. For example, the source and drain regions 114 may have a polygonal shape in which inclined surfaces 114F inclined at predetermined (or alternatively, desired) angles are connected to one another. However, the shape of the source and drain regions 114 is not limited thereto and may have various shapes depending on a material included in the fin-type active region FA, a material included in the source and drain regions 114, a type of a transistor formed in the substrate 110, and conditions of an epitaxy process.

Subsequently, an insulating layer (not shown) may be formed on the substrate 110 to cover the sacrificial gate structure 210 (refer to FIG. 10A). The insulating layer may be planarized to expose a top surface of the hard mask pattern 216 (refer to FIG. 10A) to form an inter-gate dielectric layer 132.

Thereafter, the hard mask pattern 216, the sacrificial gate 214 (refer to FIG. 10A), and the sacrificial gate insulating layer pattern 212 (refer to FIG. 10A) may be removed to form a gate space GS defined between sidewalls of a pair of gate spacers 128 and form a gate insulating layer 124 on an inner wall of the gate space GS. Next, a conductive layer (not shown) may be formed on the gate insulating layer 124 to fill the gate space GS, and an upper portion of the conductive layer may be etched back to form a gate electrode 122. Afterwards, an insulating layer (not shown) may be formed on the gate electrode 122 and the inter-gate dielectric layer 132 to fill the remaining portion of the gate space GS, and an upper portion of the insulating layer may be removed so a top surface of the inter-gate dielectric layer 132 or top surfaces of the gate spacers 128 are exposed, thereby forming a gate capping layer 126 to fill the gate space GS. Thus, a gate structure 120 including the gate electrode 122, the gate insulating layer 124, the gate capping layer 126, and the gate spacers 128 may be formed.

In some example embodiments, the process of removing the hard mask pattern 216, the sacrificial gate 214, and the sacrificial gate insulating layer pattern 212 may include a wet etching process. The wet etching process may be performed by using, for example, an etchant including $HNO_3$, diluted fluoric acid (DHF), ammonium hydroxide ($NH_4OH$), tetramethyl ammonium hydroxide (TMAH), potassium hydroxide (KOH), or a combination thereof.

Figure 12A:
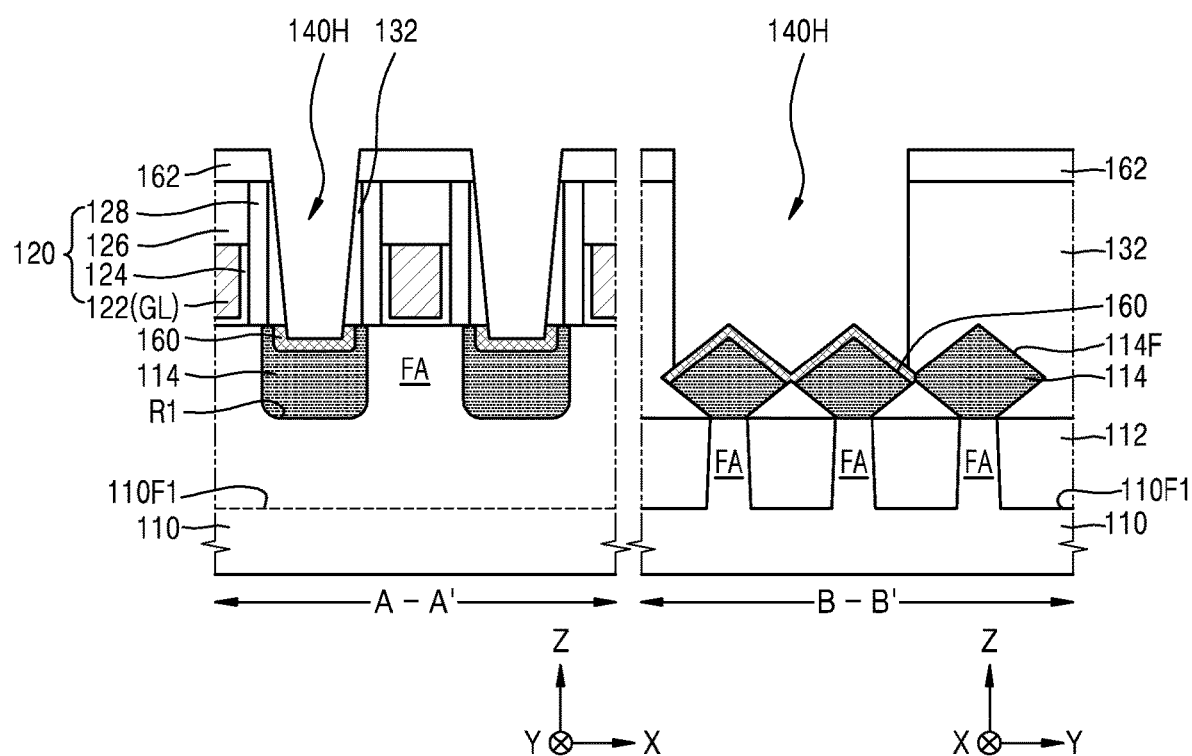
Figure 12B:
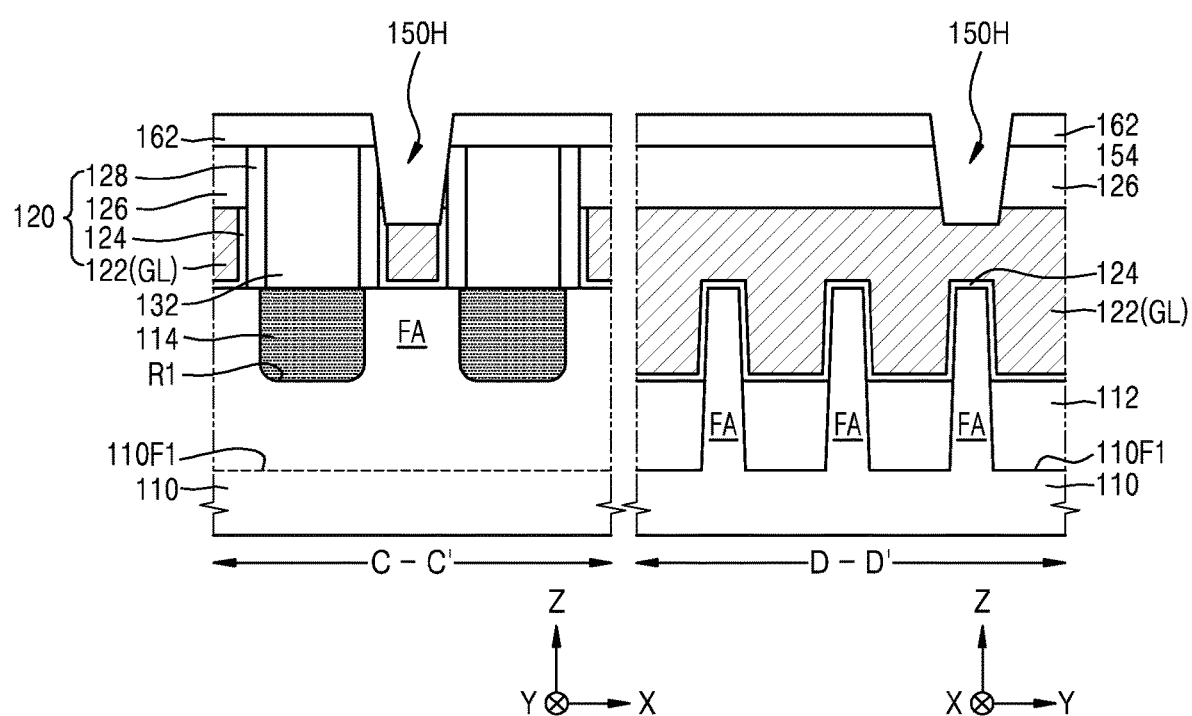

Referring to FIGS. 12A and 12B, a first insulating interlayer 162 may be formed on the gate structure 120 and the inter-gate dielectric layer 132. Thereafter, a first mask pattern (not shown) may be formed on the first insulating interlayer 162, and portions of the first insulating interlayer 162 and the inter-gate dielectric layer 132 may be etched by using the first mask pattern as an etch mask, thereby forming a first contact hole 140H exposing top surfaces of the source and drain regions 114.

A silicide layer 160 may be formed on the top surfaces of the source and drain regions 114 exposed by the first contact hole 140H. However, a process of forming the silicide layer 160 may be omitted.

Subsequently, a second mask pattern (not shown) may be formed on the first insulating interlayer 162, and portions of the first insulating interlayer 162 and the inter-gate dielectric layer 132 may be etched by using the second mask pattern as an etch mask, thereby forming a second contact hole 150H exposing a top surface of the gate electrode 122.

Figure 13A:
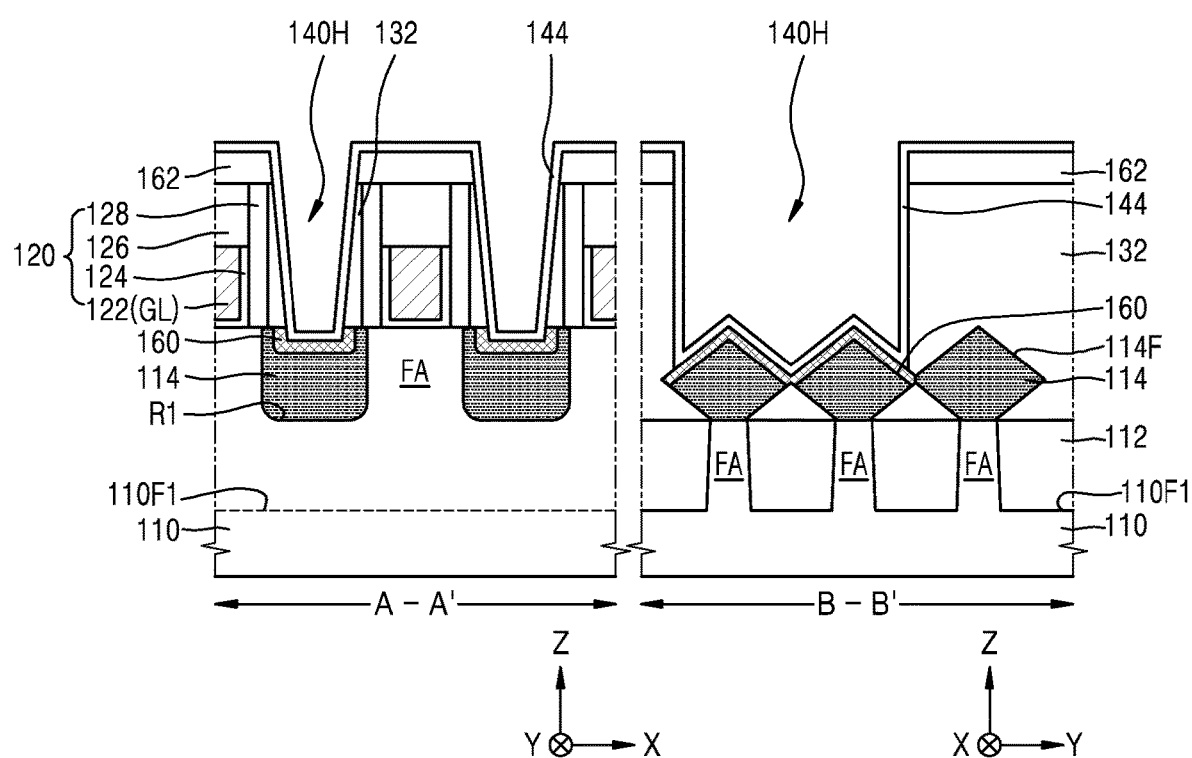
Figure 13B:
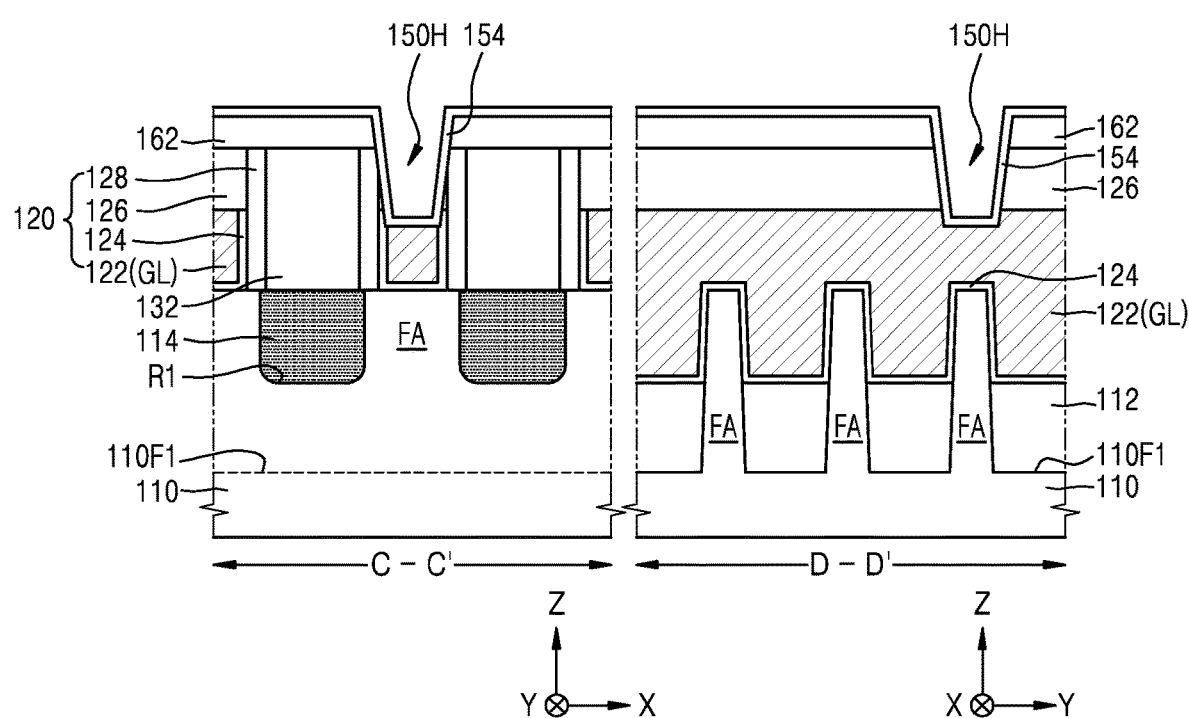

Referring to FIGS. 13A and 13B, a conductive layer (not shown) may be conformally formed on the first insulating interlayer 162 so that a first wetting layer 144 and a second wetting layer 154 may be formed on an inner wall of the first contact hole 140H and an inner wall of the second contact hole 150H, respectively.

In some example embodiments, the first wetting layer 144 and the second wetting layer 154 may be formed by using at least one of a second material, a third material, and/or a fourth material. The second to fourth materials may be applied from the above descriptions provided with reference to FIGS. 1 to 4. In some example embodiments, the first and second wetting layers 144 and 154 may be formed by using a low-temperature CVD (LTCVD) process, a low-pressure CVD (LPCVD) process, a metalorganic CVD (MOCVD) process, or an atomic layer deposition (ALD) process. For example, when the first and second wetting layers 144 and 154 include cobalt nitride ($Co_4N$), the first and second wetting layers 144 and 154 may be formed at a temperature of about 200° C. to about 300° C. by using a cobalt-containing precursor and a reactive gas containing ammonia ($NH_3$) and hydrogen ($H_2$).

Optionally, after the first wetting layer 144 and the second wetting layer 154 are formed, an annealing process may be further performed. The annealing process may be performed for several minutes to several tens of minutes at a temperature of about 300° C. to about 400° C.

Figure 14A:
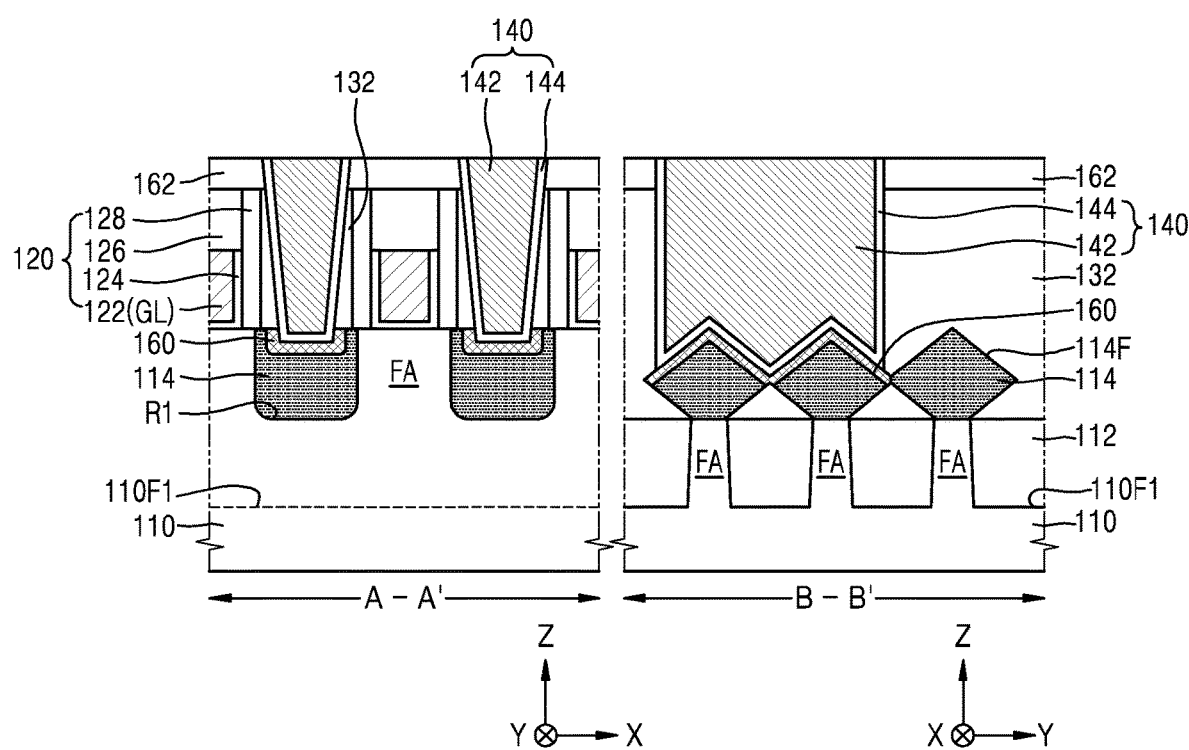
Figure 14B:
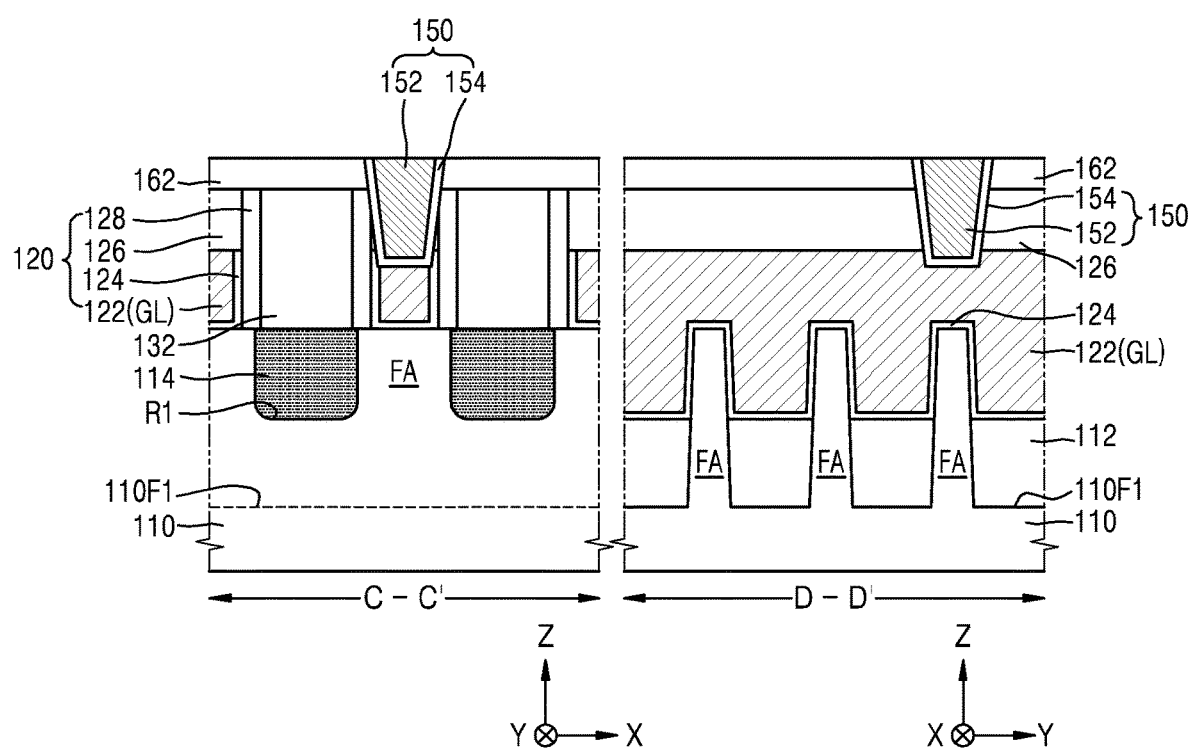

Referring to FIGS. 14A and 14B, a conductive layer (not shown) may be formed on the first wetting layer 144 and the second wetting layer 154 and planarized so that a top surface of the first insulating interlayer 162 is exposed, thereby forming a first contact plug 142 and a second contact plug 152 to fill the first contact hole 140H and the second contact hole 150H, respectively.

In some example embodiments, the first contact plug 142 and the second contact plug 152 may be formed on the first wetting layer 144 and the second wetting layer 154, respectively, which are formed on the inner walls of the first contact hole 140H and the second contact hole 150H, respectively. The first contact plug 142 and the second contact plug 152 may be formed of a first material, which may include cobalt (Co), nickel (Ni), ruthenium (Ru), copper (Cu), aluminum (Al), a silicide thereof, or an alloy thereof.

In some example embodiments, when the first wetting layer 144 may include the second material having a lattice constant, which may differ from a lattice constant of the first material by as much as about 10% or less, wetting characteristics between the second material and the first material may be improved. During the process of forming the first contact plug 142, a metal seed island (not shown) including the first material may be formed on the first wetting layer 144. The metal seed island may have a contact angle of about 90° or less with respect to the first wetting layer 144. Due to the improved adhesion characteristics or wetting characteristics between the second material and the first material, the metal seed island may be conformally formed on the inner wall of the first contact hole 140H and more easily reflow to completely fill the first contact hole 140H. Thus, voids or seams may not be formed in the first contact plug 142.

In some example embodiments, when the first wetting layer 144 includes a third material including an amorphous metal or an amorphous metal nitride, wetting characteristics between the third material and the first material may be improved. During the formation of the first contact plug 142, the metal seed island (not shown) including the first material may be formed on the first wetting layer 144. The metal seed island may have a contact angle of about 90° or less with respect to the first wetting layer 144. Due to improved adhesion characteristics or wetting characteristics between the third material and the first material, the first contact plug 142 may completely fill the inside of the first contact hole 140H, and voids or seams may not be formed in the first contact plug 142.

In some example embodiments, the first contact plug 142 and the second contact plug 152 may be formed by using an LTCVD process, an LPCVD process, an MOCVD process, or an ALD process. For example, the first wetting layer 144 and the second wetting layer 154 may be formed in a first deposition chamber of a cluster-type CVD system. Thereafter, the first contact plug 142 and the second contact plug 152 may be formed in a second deposition chamber of the cluster-type CVD system. A vacuum state in which the substrate 110 is put may not be interrupted or the substrate 110 may not be exposed to the atmosphere from the operation of forming the first wetting layer 144 and the second wetting layer 154 in the first deposition chamber to the operation of forming the first contact plug 142 and the second contact plug 152 in the second deposition chamber.

Subsequently, an annealing process may be optionally performed. The annealing process may be performed in a hydrogen ($H_2$) gas atmosphere at a temperature of about 300° C. to about 500° C. for several minutes to several tens of minutes.

Some example embodiments describe a method of forming the first contact plug 142 and the second contact plug 152 simultaneously after the first wetting layer 144 and the second wetting layer 154 are formed simultaneously, but the inventive concepts are not limited thereto. In other example embodiments, after the first wetting layer 144 is formed, the first contact plug 142 may be formed to completely form a first contact structure 140. Next, after the second wetting layer 154 is formed, the second contact plug 152 may be formed to completely form a second contact structure 150.

Figure 15A:
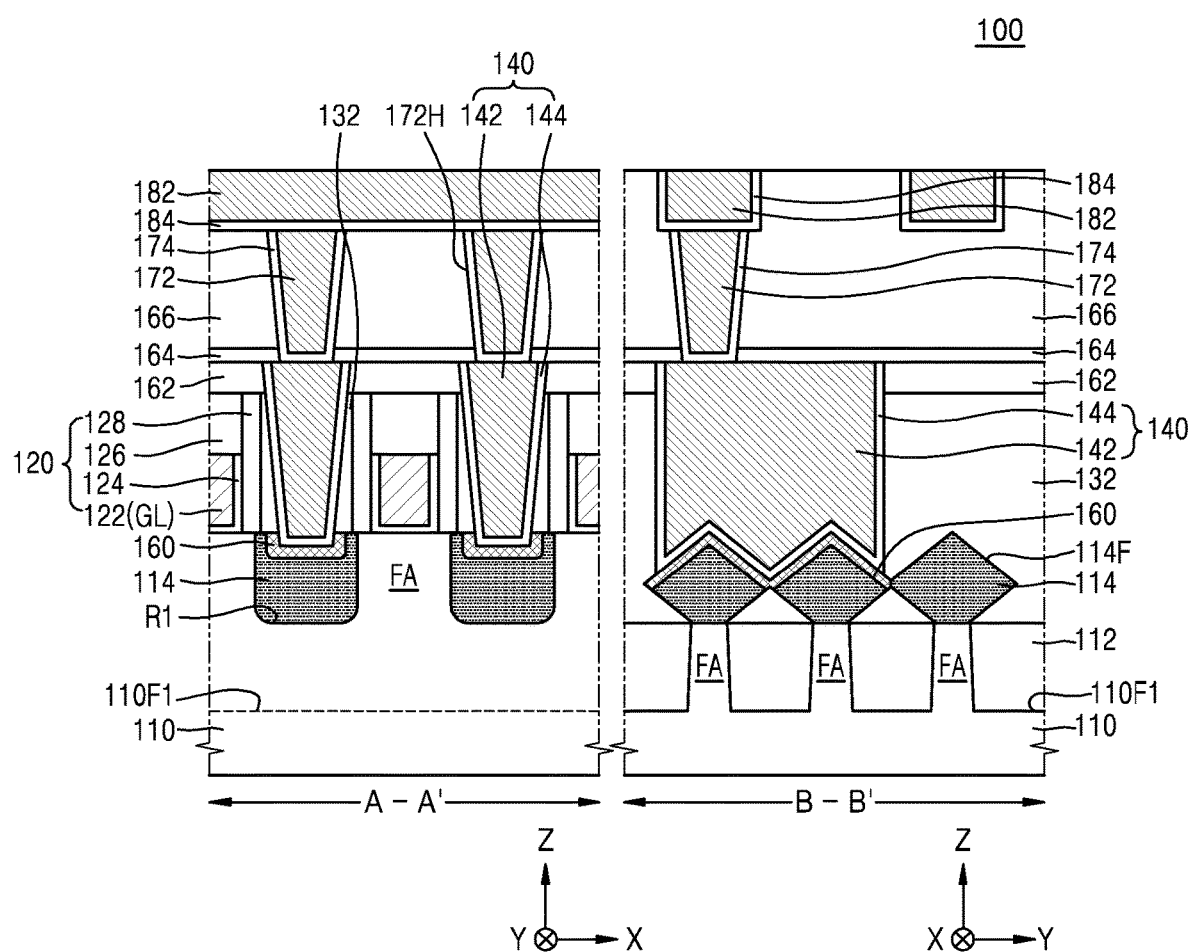
Figure 15B:
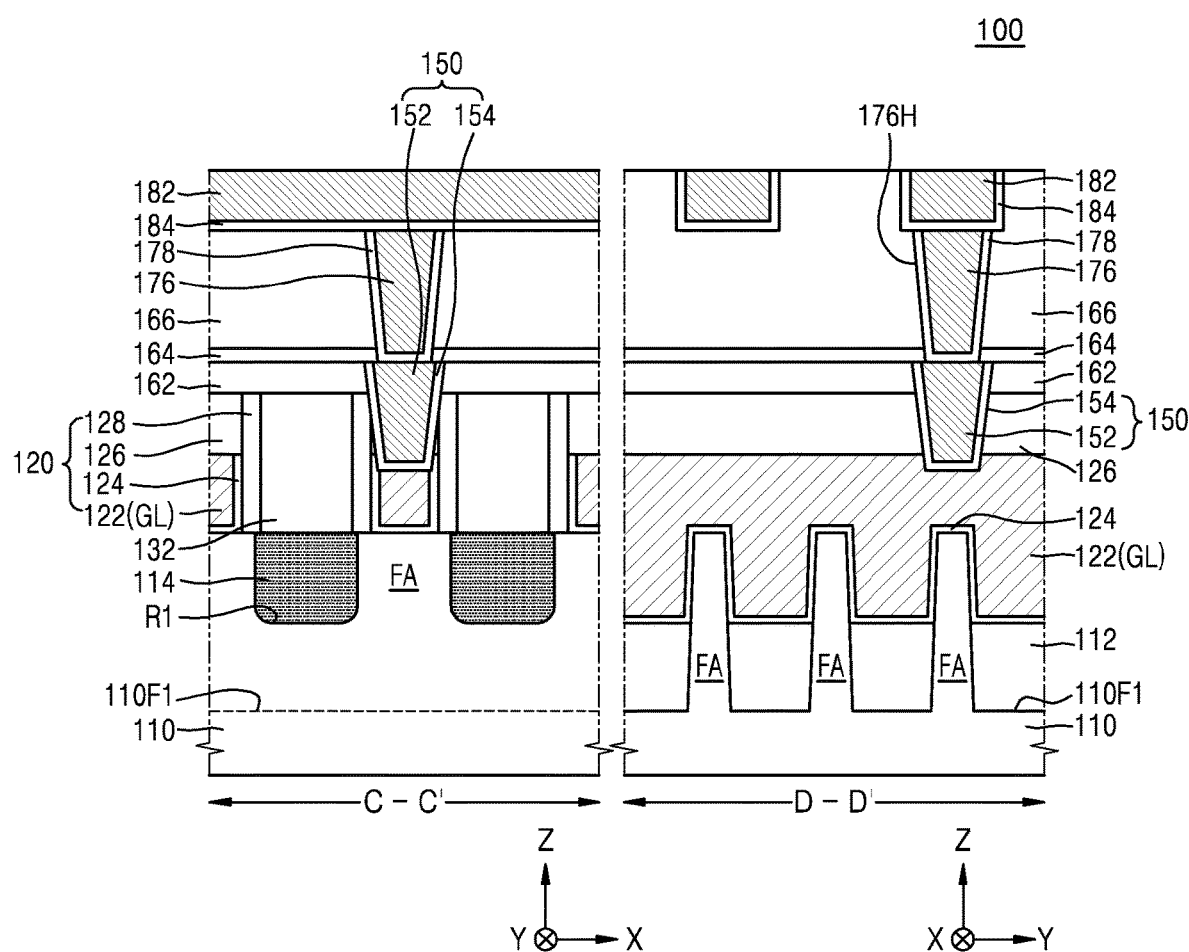

Referring to FIGS. 15A and 15B, an etch stop layer 164 and a second insulating interlayer 166 may be sequentially formed on the first insulating interlayer 162, the first contact structure 140, and the second contact structure 150. Thereafter, a first via hole 172H may be formed to expose a top surface of the first contact structure 140, and a second via hole 176H may be formed to expose a top surface of the second contact structure 150.

Thereafter, a conductive layer (not shown) may be formed on the second insulating interlayer 166, thereby forming a wetting layer 174 on an inner wall of the first via hole 172H and forming a wetting layer 178 on an inner wall of the second via hole 176H. Next, a conductive layer (not shown) may be formed within the first via hole 172H and the second via hole 176H and planarized to expose a top surface of the second insulating interlayer 166 so that a first via 172 and a second via 176 may be formed to fill the first via hole 172H and the second via hole 176H, respectively.

Subsequently, the second insulating interlayer 166 may be etched to form an interconnection opening (not shown), and a wetting layer 184 and an interconnection layer 182 may be sequentially formed on an inner wall of the interconnection opening.

In general, when a conductive barrier layer including titanium nitride (TiN) is formed and the first contact plug 142 is formed on the conductive barrier layer, since adhesion characteristics between the first contact plug 142 and the conductive barrier layer are not as good, the first contact plug 142 may be formed to have a double-layered structure of a seed layer and a filling layer. For example, the seed layer may be formed to a thickness of several Å to several nm by using a physical vapor deposition (PVD) process, and the filling layer may be formed by using a CVD process to fill up the entire first contact hole 140H. Since the PVD process for forming the seed layer needs to use a different deposition system from the CVD process for forming the filling layer, a method of manufacturing the first contact plug 142 having the double-layered structure may be more complicated.

However, according to the above-described method of manufacturing the IC device 100, the seed layer may be omitted due to improved adhesion characteristics and/or wetting characteristics between the first material and the second material or improved adhesion characteristics and wetting characteristics between the first and third material. Accordingly, by using the cluster-type CVD system, the first wetting layer 144 may be formed in the first deposition chamber, and the first contact plug 142 may be formed in the second deposition chamber. As a result, the process of manufacturing the first contact structure 140 may be simplified.

In the process described with reference to FIGS. 12A and 12B, after a first conductive barrier layer 146 and a second conductive barrier layer 156 are formed on the inner walls of the first contact hole 140H and the second contact hole 150H, the first wetting layer 144 and the second wetting layer 154 may be formed on the first conductive barrier layer 146 and the second conductive barrier layer 156, respectively. In this case, the IC device 100A described with reference to FIGS. 5 to 7 may be obtained.

Furthermore, in the process described with reference to FIGS. 13A and 13B, a first contact hole 140HA may be formed by using the gate spacers 128A and the gate capping layer 126 as a self-aligned mask without forming the first insulating interlayer 162. In this case, the IC device 100 described with reference to FIG. 8 may be obtained.

In addition, in the process described with reference to FIGS. 10A and 10B, preliminary gate spacers (not shown) may be formed instead of the gate spacers 128. Subsequently, after a first contact structure 140B is formed, the preliminary gate spacers may be removed. Gate spacers 128B including air spaces AS may be formed in spaces from which the preliminary gate spacers are removed, by using an insulating material having poorer step coverage characteristics. In this case, the IC device 100C described with reference to FIG. 9 may be obtained. In other example embodiments, the gate spacers 128B may be formed to have a stack structure of a first spacer layer (not shown), a sacrificial layer (not shown), and a second spacer layer (not shown). Subsequently, the sacrificial layer may be selectively removed to form the gate spacers 128B including air spaces AS.

While the inventive concepts have been particularly shown and described with reference to embodiments thereof, it will be understood that various changes in form and details may be made therein without departing from the spirit and scope of the following claims.

What is claimed is:
1. An integrated circuit device comprising:
a substrate having a fin-type active region extending in a first direction;
a gate structure intersecting the fin-type active region on the substrate, the gate structure extending in a second direction perpendicular to the first direction and parallel to a top surface of the substrate;
source and drain regions on both sides of the gate structure;
an inter-gate dielectric layer on both sides of the gate structure; and
a first contact structure electrically connected to one of the source and drain regions, the first contact structure comprising a first contact plug comprising a first material and a first wetting layer surrounding the first contact plug, the first wetting layer comprising a second material having a lattice constant that differs from a lattice constant of the first material by about 10% or less,
wherein
the first contact structure further comprises a first conductive barrier layer surrounding the first wetting layer, the first conductive barrier layer comprising titanium nitride (TiN), and
the first conductive barrier layer is in contact with the ionter-gate dielectric layer.
2. The integrated circuit device of claim 1, wherein the first material comprises cobalt (Co), nickel (Ni), ruthenium (Ru), copper (Cu), aluminum (Al), a silicide thereof, or an alloy thereof, and
the second material comprises at least one of cobalt nitride (CNN), zinc nitride (ZnN), zinc oxide (ZnO), aluminum nitride (AlN), and gallium nitride (GaN).
3. The integrated circuit device of claim 1, further comprising an inter-gate dielectric layer on both sides of the gate structure,
wherein the first wetting layer is in contact with the inter-gate dielectric layer.
4. The integrated circuit device of claim 1, wherein the gate structure comprises a gate electrode extending in the second direction across the fm-type active region and gate spacers on both sides of the gate electrode,
wherein the first wetting layer is in contact with the gate spacers.
5. The integrated circuit device of claim 1, further comprising a second contact structure on the gate structure, the second contact structure electrically connected to the gate structure, the second contact structure comprising a second contact plug comprising the first material and a second wetting layer surrounding the second contact plug, the second wetting layer comprising the second material.
6. The integrated circuit device of claim 5, wherein the second contact structure further comprises a second conductive barrier layer surrounding the second wetting layer, the second conductive barrier layer comprising TiN.
7. An integrated circuit device comprising:
a substrate having a fin-type active region extending in a first direction;
a gate structure intersecting the fin-type active region on the substrate, the gate structure extending in a second direction perpendicular to the first direction and parallel to a top surface of the substrate, the gate structure comprising a gate electrode extending in the second direction across the fin-type active region and gate spacers on both sides of the gate electrode;

source and drain regions on both sides of the gate structure; and a first contact structure electrically connected to one of the source and drain regions the first contact structure comprising a first contact plug comprising a first material and a first wetting layer surrounding the first contact plug, the first wetting layer comprising at least one of a third material and a fourth material, wherein the third material comprises an amorphous metal or an amorphous metal nitride, the fourth material comprises a superconductor metal or a superconductor metal nitride, and the first wetting layer is in contact with the gate spacers.

8. The integrated circuit device of claim 7, wherein the first material comprises cobalt (Co), nickel (Ni), ruthenium (Ru), copper (Cu), aluminum (Al), a silicide thereof, or an alloy thereof, the third material comprises at least one of tungsten nitride (WN), tungsten carbonitride (WCN), and titanium cobalt (TiCo), and the fourth material comprises at least one of niobium aluminide (Nb3Al), niobium nitride (NbN), and titanium cobalt (Ti2Co).

9. The integrated circuit device of claim 7, wherein the first contact structure further comprises a first conductive barrier layer surrounding the first wetting layer, the first conductive barrier layer comprising TiN.

10. The integrated circuit device of claim 7, further comprising a second contact structure on the gate structure, the second contact structure being electrically connected to the gate structure, the second contact structure comprising a second contact plug comprising the first material and a second wetting layer surrounding the second contact plug, the second wetting layer comprising at least one of the third material and the fourth material.

11. An integrated circuit device comprising:

a substrate having a fin-type active region extending in a first direction;

a gate structure intersecting the fm-type active region on the substrate, the gate structure extending in a second direction perpendicular to the first direction and parallel to a top surface of the substrate;

an inter-gate dielectric layer on both sides of the gate structure;

source and drain regions on both sides of the gate structure;

a first contact structure electrically connected to one of the source and drain regions, the first contact structure comprising a first contact plug comprising a first material and a first wetting layer surrounding the first contact plug, the first wetting layer comprising at least one of a second material, a third material, and a fourth material; and a second contact structure on the gate structure, the second contact structure electrically connected to the gate structure, the second contact structure comprising a second contact plug comprising the first material and a second wetting layer surrounding the second contact plug, the second wetting layer comprising at least one of the second material, the third material, and the fourth material, wherein the second material comprises a metal oxide or a metal nitride having a lattice constant that differs from a lattice constant of the first material by about 10% or less, the third material comprises an amorphous metal or an amorphous metal nitride, the fourth material comprises a superconductor metal or a superconductor metal nitride, the first contact structure further comprises a first conductive barrier layer surrounding the first wetting layer, the first conductive barrier layer comprising TiN, and the first conductive barrier layer is in contact with the inter-gate dielectric layer.

12. The integrated circuit device of claim 11, wherein the first material comprises cobalt (Co), nickel (Ni), ruthenium (Ru), copper (Cu), aluminum (Al), a silicide thereof, or an alloy thereof, the second material comprises at least one of Co4N, ZnN, ZnO, MN, and GaN, the third material comprises at least one of WN, WCN, and TiCo, and the fourth material comprises at least one of $Nb_3Al$, NbN, and Ti2Co.

13. The integrated circuit device of claim 11, further comprising an inter-gate dielectric layer on both sidewalls of the gate structure, wherein the first wetting layer is in contact with the inter-gate dielectric layer.

14. The integrated circuit device of claim 11, wherein the gate structure comprises a gate electrode extending in the second direction across the fm-type active region and gate spacers on both sidewalls of the gate electrode, wherein the first wetting layer is in contact with the gate spacers.

* * * * *